United States Patent
Kim

(10) Patent No.: US 9,659,658 B2
(45) Date of Patent: May 23, 2017

(54) NONVOLATILE MEMORY DEVICE, STORAGE DEVICE INCLUDING THE NONVOLATILE MEMORY DEVICE, AND OPERATING METHOD OF THE STORAGE DEVICE

(71) Applicant: SAMSUNG ELECTRONICS CO., LTD., Suwon-si, Gyeonggi-do (KR)

(72) Inventor: Dae han Kim, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 7 days.

(21) Appl. No.: 14/596,677

(22) Filed: Jan. 14, 2015

(65) Prior Publication Data
US 2015/0332770 A1 Nov. 19, 2015

(30) Foreign Application Priority Data
May 13, 2014 (KR) .................. 10-2014-0057311

(51) Int. Cl.
| G11C 16/10 | (2006.01) |
| G11C 16/34 | (2006.01) |
| G11C 16/04 | (2006.01) |
| G11C 16/20 | (2006.01) |
| G11C 16/22 | (2006.01) |

(52) U.S. Cl.
CPC .......... *G11C 16/10* (2013.01); *G11C 16/0483* (2013.01); *G11C 16/20* (2013.01); *G11C 16/22* (2013.01); *G11C 16/3459* (2013.01)

(58) Field of Classification Search
USPC .. 365/185.12, 185.2, 185.03, 200, 226, 228; 711/103
See application file for complete search history.

(56) References Cited

U.S. PATENT DOCUMENTS

| 7,397,686 B2 * | 7/2008 | Takashima .......... G06F 12/0246 365/145 |
| 8,027,194 B2 | 9/2011 | Lee et al. |
| 8,171,205 B2 | 5/2012 | Royer et al. |
| 8,364,885 B2 * | 1/2013 | Yang .................. G06F 12/0246 711/103 |
| 8,527,693 B2 | 9/2013 | Flynn et al. |

(Continued)

FOREIGN PATENT DOCUMENTS

| JP | 2010-134856 | 6/2010 |
| JP | 2010-225012 | 10/2010 |

(Continued)

*Primary Examiner* — Vu Le
*Assistant Examiner* — Sung Cho
(74) *Attorney, Agent, or Firm* — F. Chau & Associates, LLC

(57) ABSTRACT

A storage device includes a nonvolatile memory device and a memory controller is provided. The nonvolatile memory device includes a plurality of blocks. The memory controller is configured to detect, upon receiving a power-on signal, a partial block among the plurality of blocks. The partial block includes a first page incompletely programmed due to sudden power-off occurred to the storage device. The memory controller determines whether or not to perform a dummy program operation on the partial block, and programs a second page of the partial bock with dummy data. The first page is different from the second page.

18 Claims, 22 Drawing Sheets

(56) References Cited

U.S. PATENT DOCUMENTS

| | | | |
|---|---|---|---|
| 8,559,234 B2 | 10/2013 | Kumazaki et al. | |
| 8,661,301 B1* | 2/2014 | Yen | G11C 16/22 711/103 |
| 8,732,388 B2* | 5/2014 | Chen | G06F 12/0246 711/103 |
| 8,819,337 B1* | 8/2014 | Oshinsky | G06F 11/1441 365/185.07 |
| 2004/0083405 A1* | 4/2004 | Chang | G06F 11/0763 714/24 |
| 2007/0268754 A1* | 11/2007 | Lee | G06F 12/1416 365/185.29 |
| 2008/0028129 A1* | 1/2008 | Nakanishi | G06F 11/1441 711/103 |
| 2009/0043951 A1* | 2/2009 | Shalvi | G11C 11/56 711/103 |
| 2009/0168522 A1* | 7/2009 | Shibata | G06F 11/1068 365/185.09 |
| 2009/0262577 A1* | 10/2009 | Tanaka | G11C 11/5628 365/185.03 |
| 2010/0061150 A1* | 3/2010 | Wu | G11C 16/349 365/185.08 |
| 2010/0095148 A1* | 4/2010 | Cheng | G06F 11/1068 714/6.13 |
| 2010/0106897 A1* | 4/2010 | Yoshimura | G11C 16/10 711/103 |
| 2010/0169543 A1* | 7/2010 | Edgington | G06F 12/0246 711/103 |
| 2010/0172180 A1* | 7/2010 | Paley | G06F 12/0246 365/185.12 |
| 2010/0174846 A1* | 7/2010 | Paley | G06F 12/0246 711/103 |
| 2010/0246260 A1* | 9/2010 | Kang | G11C 11/5621 365/185.03 |
| 2010/0293317 A1* | 11/2010 | Confalonieri | G06F 3/0607 711/103 |
| 2011/0055625 A1* | 3/2011 | Honda | G06F 11/141 714/6.11 |
| 2011/0149650 A1* | 6/2011 | Huang | G06F 12/0246 365/185.03 |
| 2012/0265923 A1* | 10/2012 | Kuo | G06F 12/0246 711/103 |
| 2013/0117500 A1* | 5/2013 | Joo | G06F 12/0246 711/103 |
| 2013/0219110 A1* | 8/2013 | Landenbach | G06F 12/0246 711/103 |
| 2013/0250677 A1 | 9/2013 | Nam et al. | |
| 2014/0068383 A1* | 3/2014 | Cheng | G06F 12/00 714/773 |
| 2015/0070996 A1* | 3/2015 | Kim | G11C 16/10 365/185.12 |
| 2015/0078098 A1 | 3/2015 | Kwak et al. | |
| 2015/0092487 A1* | 4/2015 | Phan | G11C 16/225 365/185.03 |
| 2015/0109859 A1* | 4/2015 | Hsu | G11C 16/225 365/185.03 |
| 2015/0127887 A1* | 5/2015 | Kim | G11C 5/143 711/103 |
| 2015/0170747 A1* | 6/2015 | Liu | G11C 16/107 365/185.03 |
| 2015/0213896 A1* | 7/2015 | Lieber | G06F 3/061 711/103 |

FOREIGN PATENT DOCUMENTS

| | | |
|---|---|---|
| JP | 2013-003655 | 1/2013 |
| JP | 2013-008078 | 1/2013 |
| JP | 2013-178865 | 9/2013 |
| JP | 2013-218371 | 10/2013 |
| KR | 1020150032389 | 3/2015 |

* cited by examiner

NONVOLATILE MEMORY DEVICE, STORAGE DEVICE INCLUDING THE NONVOLATILE MEMORY DEVICE, AND OPERATING METHOD OF THE STORAGE DEVICE

CROSS-REFERENCE TO RELATED APPLICATION

This application claims priority under 35 U.S.C. §119 to Korean Patent Application No. 10-2014-0057311, filed on May 13, 2014 in the Korean Intellectual Property Office, the disclosure of which is incorporated by reference herein in its entirety.

TECHNICAL FIELD

The present inventive concept relates to a nonvolatile memory device, a storage devices including the same and, an operating method of the storage device.

DISCUSSION OF RELATED ART

Semiconductor memory devices are classified into volatile memory devices and nonvolatile memory devices. Volatile memory devices lose their stored data when their power supplies are interrupted. Volatile memory devices include a dynamic random access memory (DRAM) and a static RAM (SRAM). Nonvolatile memory devices retain their stored data after their power supplies are interrupted. Nonvolatile memory devices include a read only memory (ROM), a programmable ROM (PROM), an erasable PROM (EPROM), a phase change RAM (PRAM), a restive RAM (REAM), and a flash memory.

Nonvolatile memory devices have been developed to have three-dimensional structures for increased integration density. Three-dimensional nonvolatile memory devices exhibit faster write speed, extended cell lifetime, and increased power efficiency. A three-dimensional nonvolatile memory device and a conventional two-dimensional nonvolatile memory device are structurally different from each other. Due to the structural difference between the three-dimensional and two-dimensional nonvolatile memory devices, various methods for driving three-dimensional nonvolatile memory devices have been studied.

SUMMARY

According to an exemplary embodiment of the present inventive concept, a storage device includes a nonvolatile memory device and a memory controller. The nonvolatile memory device includes a plurality of blocks. The memory controller is configured to detect, upon receiving a power-on signal, a partial block among the plurality of blocks. The partial block includes a first page incompletely programmed due to sudden power-off occurred to the storage device. The memory controller determines whether or not to perform a dummy program operation on the partial block, and programs a second page of the partial bock with dummy data. The first page is different from the second page.

According to an exemplary embodiment of the present inventive concept, an operating method of a storage device is provided. The storage device includes a nonvolatile memory device including a plurality of blocks and a memory controller configured to control the nonvolatile memory device. A partial block is detected. The partial block includes a first page incompletely programmed due to sudden power-off occurred to the storage device. A dummy program operation is performed on a second page of the partial block by using dummy data. The first page is different from the second page.

According to an exemplary embodiment of the present inventive concept, an operating method of a storage device is provided. Whether a nonvolatile memory includes a partial block is detected. The partial block includes a first page incompletely programmed due to sudden power-off occurred to the storage device. A dummy program operation is performed on a second page of the partial block using dummy data. The second page is disposed between the first page and a string selection transistor of the nonvolatile memory. A copyback operation is performed to move valid data of the partial block to another block different from the partial block.

BRIEF DESCRIPTION OF THE DRAWINGS

These and other features of the inventive concept will become more apparent by describing in detail exemplary embodiments thereof with reference to the accompanying drawings of which.

DETAILED DESCRIPTION OF EXEMPLARY EMBODIMENTS

Figure 1:
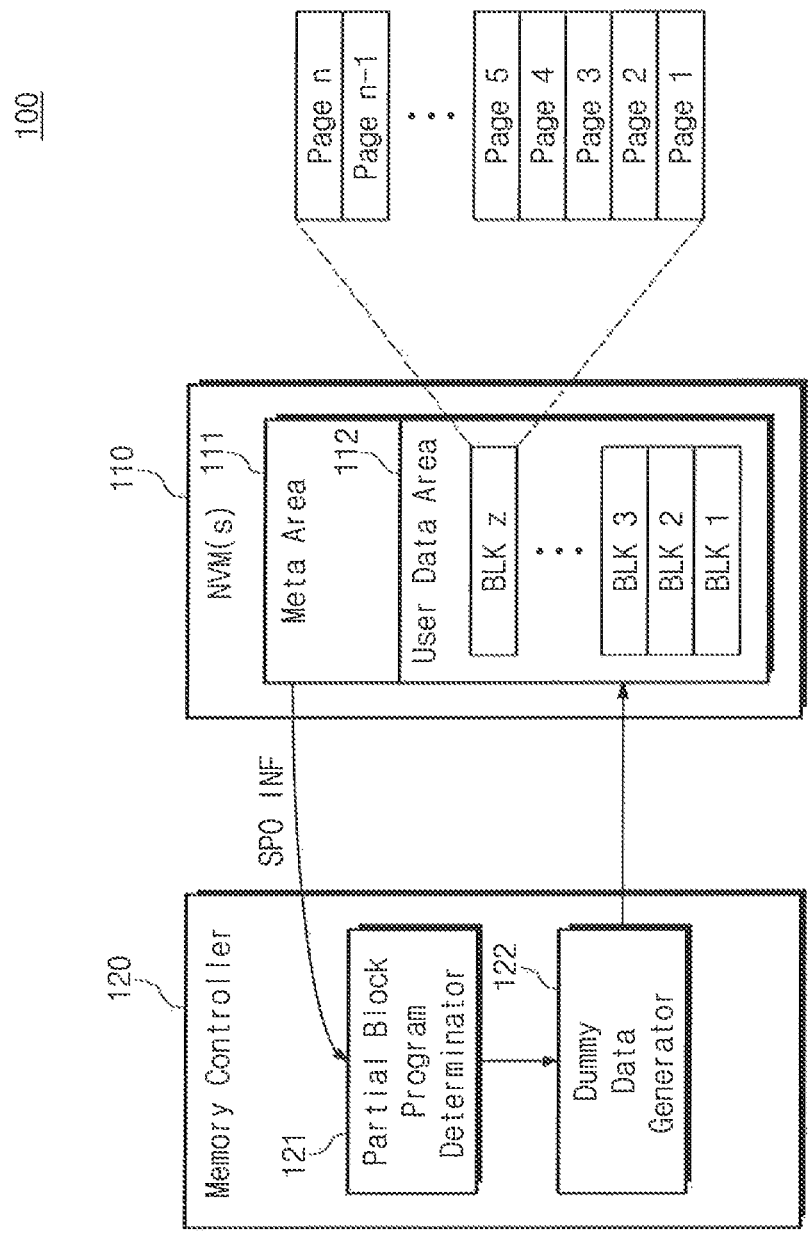
FIG. 1 is a block diagram of a storage device according to an exemplary embodiment of the inventive concept.

Exemplary embodiments of the inventive concept will be described below in detail with reference to the accompanying drawings. However, the inventive concept may be embodied in different forms and should not be construed as limited to the embodiments set forth herein. In the drawings, the thickness of layers and regions may be exaggerated for clarity. It will also be understood that when an element is referred to as being "on" another element or substrate, it may be directly on the other element or substrate, or intervening layers may also be present. It will also be understood that when an element is referred to as being "coupled to" or "connected to" another element, it may be directly coupled to or connected to the other element, or intervening elements may also be present. Like reference numerals may refer to the like elements throughout the specification and drawings.

FIG. 1 is a block diagram of a storage device 100 according to an exemplary embodiment of the inventive concept. The storage device 100 includes a nonvolatile memory device 110 and a memory controller 120.

The nonvolatile memory device 110 includes a meta area 111 to store management information for managing the nonvolatile memory device 110 and a user data area 112 to store user data. The user data area 112 includes a plurality of memory blocks BLK1 to BLKz. The number of z is an integer equal to or greater than 2. Each of the memory blocks BLK1 to BLKz includes a plurality of pages Page 1 to Page n. The number of a is an integer equal to or greater than 2.

The meta area 111 may include at least one memory block having the same structure as each of the memory blocks BLK1 to BLKz in the user data area 112. The meta area 111 may store information on whether pages included in at least one memory block are completely programmed. The meta area 111 may also include power supply information. For example, the power supply information may include information of normal power-off, hereinafter referred to as "NPO" and sudden power off, hereinafter referred to as "SPO".

If the nonvolatile memory device 110 is powered off after a page completely is programmed, the power supply information may indicate to NPO. Otherwise, the power supply information may indicate to SPO.

In the nonvolatile memory device 100, if a program operation of a block is stopped due to power-off before completed, the block is called a partial block. The partial block may refer to a block in which at least one page is not completely programmed due to SPO.

The memory controller 120 may determine based on the power supply information whether a block is a partial block, and may perform a dummy program operation on at least one page of the partial block. The memory controller 120 may include a partial block program determinator 121 and a dummy data generator 122.

The partial block program determinator 121 may receive the power supply information from the meta area 111 of the nonvolatile memory device 110. If the partial block program determinator 121 detects SPO based on the power supply information, the dummy data generator 122 generates dummy data in response to a determination result of the partial block program determinator 121. The memory controller 120 may perform a dummy program operation on the partial block of the nonvolatile memory device 110 using the dummy data.

The dummy data may be random data, and may be programmed in at least one upper page which may be disposed above a page which is incompletely programmed.

Figure 17:
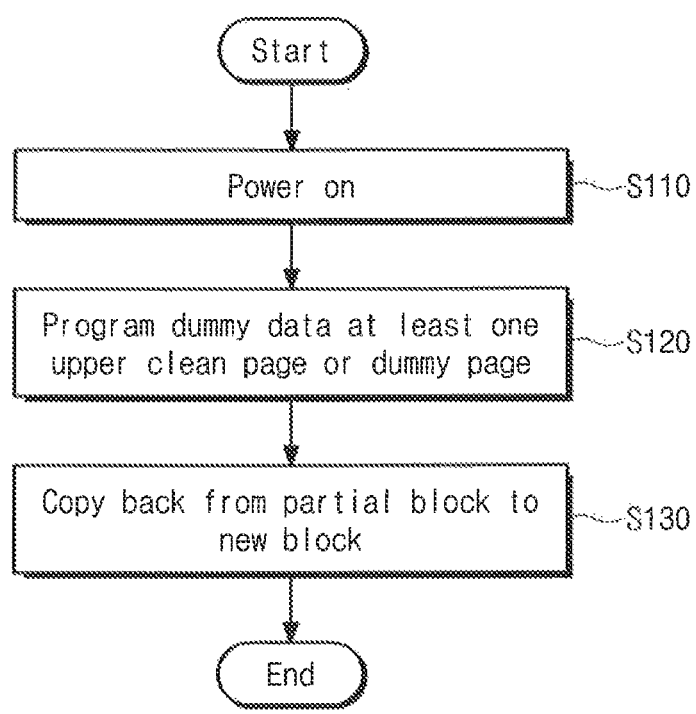
FIG. 17 is a flowchart illustrating a programming method of a storage device according to an exemplary embodiment of the inventive concept.
Figure 19:
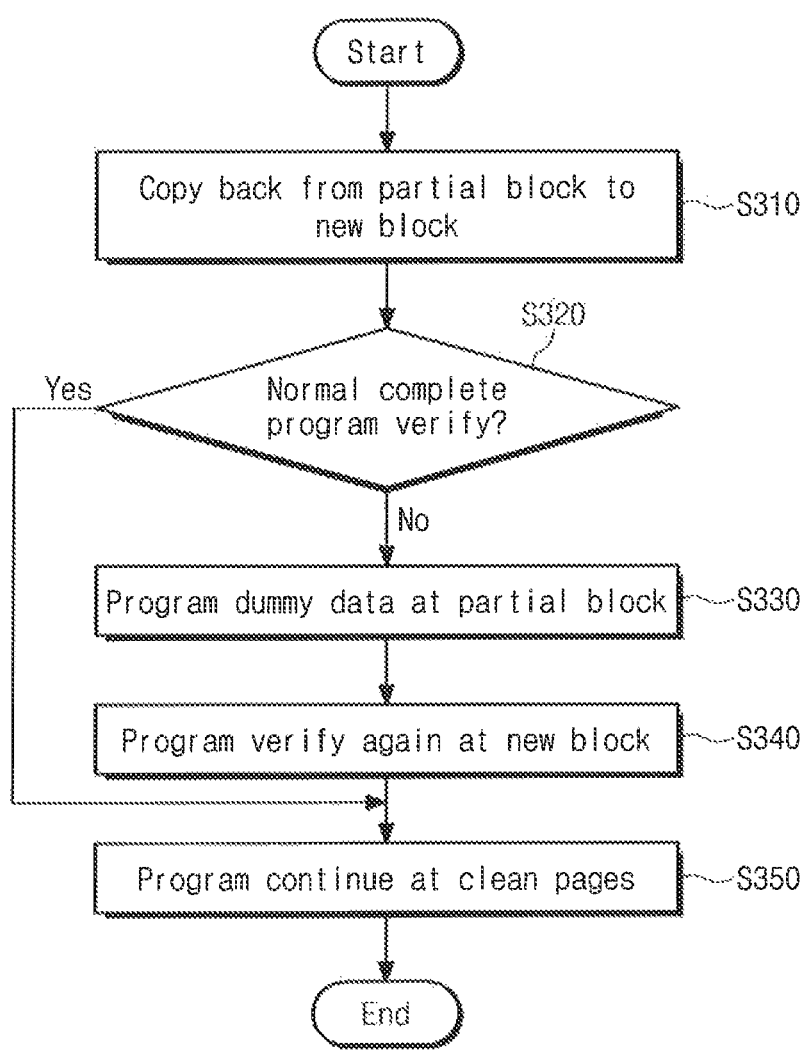
FIG. 19 is a flowchart illustrating a programming method of a storage device according to an exemplary embodiment of the inventive concept.

The at least one page may be a clean page or a dummy page. The clean page may refer to a page in an erased state. In an exemplary embodiment, a dummy program operation of a partial block may be performed if a partial block occurs as shown in FIG. 17. In an exemplary embodiment, a dummy program operation of a partial block may be performed depending on whether a copyback operation for a partial block is completed as shown in FIG. 19. The descriptions of FIGS. 17 and 19 will be made later.

Figure 2:
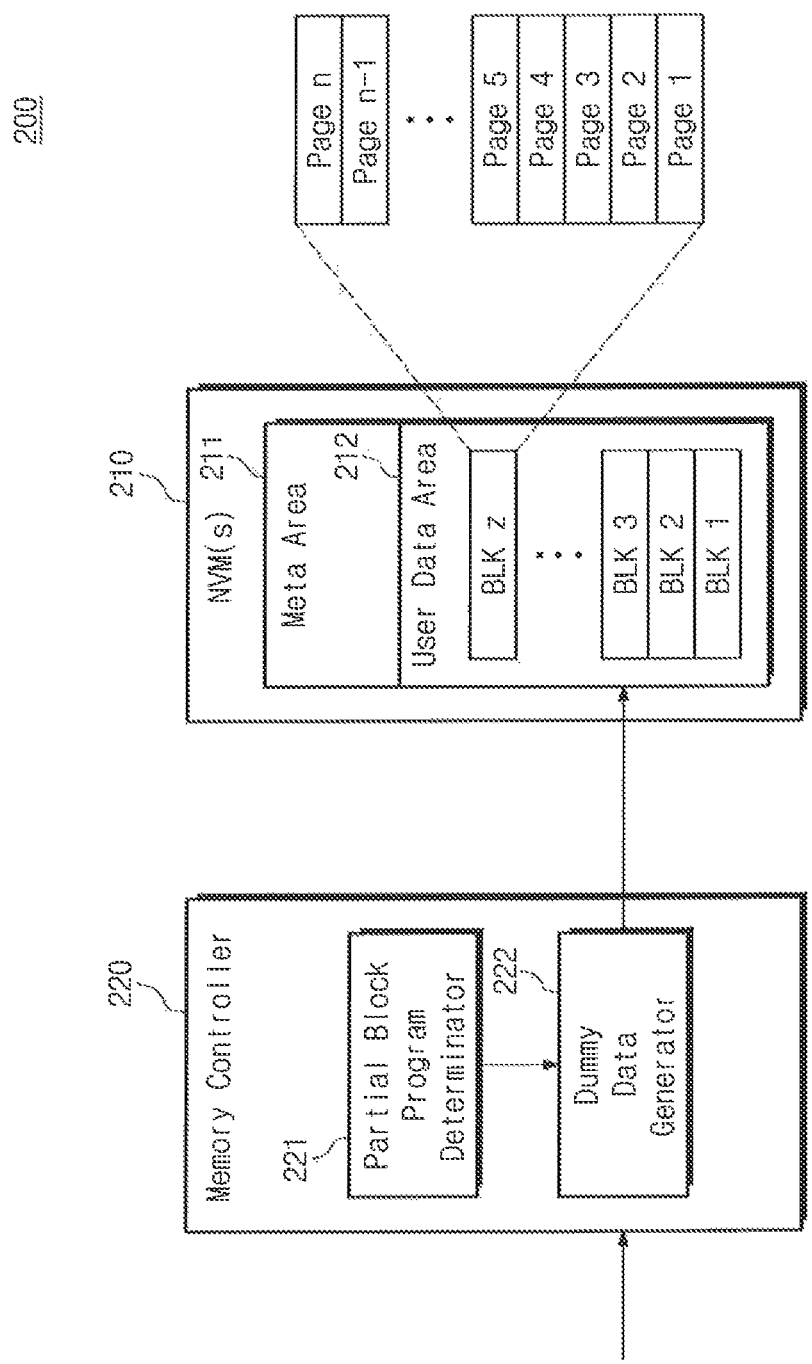
FIG. 2 is a block diagram of a storage device according to an exemplary embodiment of the inventive concept.

FIG. 2 is a block diagram of a storage device 200 according to an exemplary embodiment of the inventive concept. Referring to FIG. 2, the storage device 200 includes a nonvolatile memory device 210 and a memory controller 220.

The memory controller 220 may include a partial block program determinator 221 and a dummy data generator 222. The memory controller 200 may program at least one upper page of the partial block with dummy data to increase power efficiency during a command of a host or a program operation.

Figure 3:
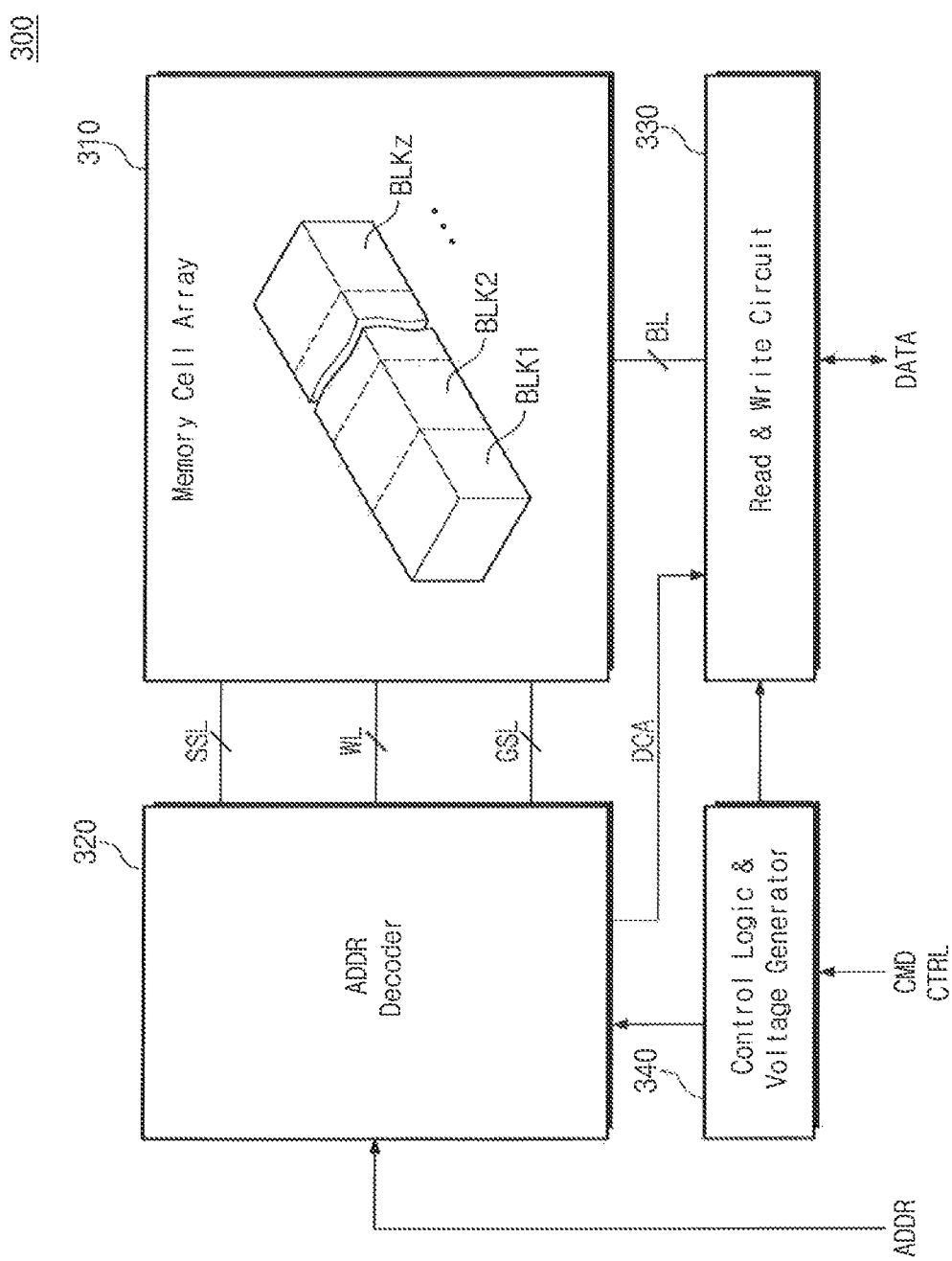
FIG. 3 is a block diagram of a nonvolatile memory device according to an exemplary embodiment of the inventive concept.

FIG. 3 is a block diagram of a nonvolatile memory device 300 according to an exemplary embodiment of the inventive concept. The nonvolatile memory device 300 includes a memory cell array 310, an address decoder 320, a read and write circuit 330, and a control logic and voltage generator 340. The nonvolatile memory device 300 corresponds to the nonvolatile memory devices 110 and 210 in FIGS. 1 and 2.

The memory cell array 310 is connected to the address decoder 320 through a plurality of string select lines SSL, wordlines WL, and ground select lines GSL. The memory cell array 310 is connected to the read and write circuit 330 through a plurality of bitlines BL. The memory cell array 310 includes a plurality of memory blocks BLK1 to BLKz. The memory blocks BLK1 to BLKz may include a plurality of memory cells and a plurality of select transistors. The memory cells may be stacked on a substrate to constitute a three-dimensional structure. Each of the memory cells may store a single bit or multiple bits.

The address decoder 320 is connected to the memory cell array 310 through a plurality of string select lines SSL, wordlines WL, and ground select lines GSL. The address decoder 320 operates in response to a control signal of the control logic and voltage generator 340. The address decoder 320 externally receives an address ADDR.

The address decoder 320 may decode the received address ADDR. The address decoder 320 may control a voltage applied to wordlines WL according to the decoded address. For example, during a program operation, the address decoder 320 may apply a pass voltage to the wordlines WL according to the control of the control logic and voltage generator 340. During the program operation, the address decoder 320 may further apply a voltage to at least one wordline selected by a decoded address among the wordlines WL according to the control of the control logic and voltage generator 340.

The read and write circuit 330 is connected to the memory cell array 310 through a plurality of bitlines BL. The read and write circuit 330 may exchange data DATA with an external entity. The read and write circuit 330 operates in response to the control of the control logic and voltage generator 340. The read and write circuit 330 receives a decoded column address DCA from the address decoder 320.

The read and write circuit 330 may select bitlines BL using the decoded column address DCA. During a program operation, the read and write circuit 330 externally receives data DATA. The read and write circuit 330 applies the received data DATA to the memory cell array 310 through the plurality of bitlines BL. During a read operation, the read and write circuit 320 reads data DATA from the memory cell array 310. The read and write circuit 330 transmits the read data DATA to an external entity.

In an exemplary embodiment, the read and write circuit 330 may include a page buffer, a column select circuit, and the like. In an exemplary embodiment, the read and write circuit 330 may include a Sense amplifier, a write driver, a column select circuit, and the like.

The control logic and voltage generator 340 is connected to the address decoder 320 and the read and write circuit 330. The control logic and voltage generator 340 operates in response to a control signal CTRL and a command CMD that are externally applied. The control logic and voltage generator 340 may decode the received command CMD and control the overall operation of the nonvolatile memory device 300 according to the decoded command CMD. The control logic and voltage generator 340 may generate various control signals and voltages according to the received control signal CTRL.

Figure 4:
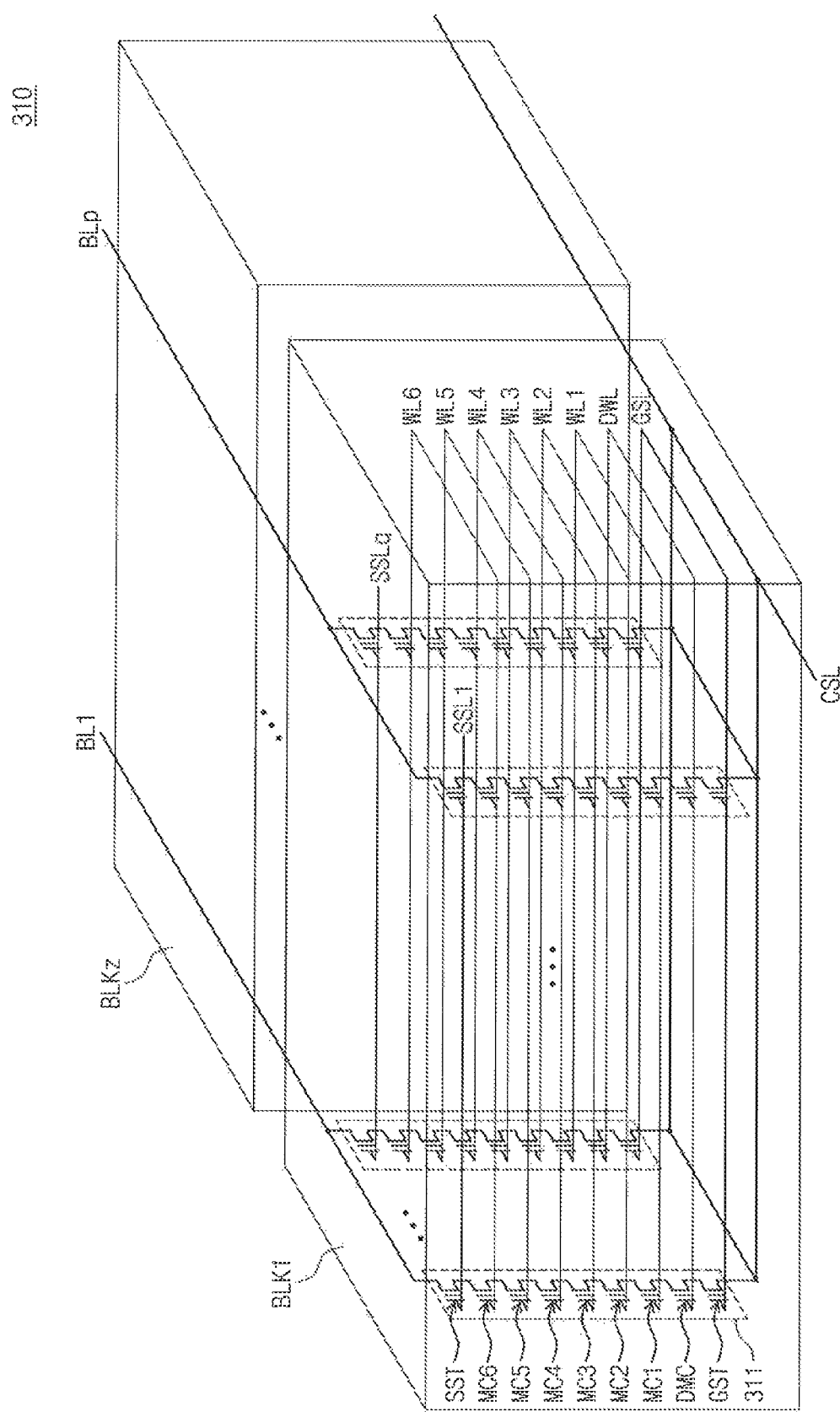
FIG. 4 is a circuit diagram of a memory cell array in FIG. 3.

FIG. 4 is a circuit diagram of the memory cell array 310 in FIG. 3. Referring to FIG. 4, the memory cell array 310 includes a plurality of memory blocks BLK1 to BLKz. For brevity of description, the first memory block BLK1 will be described. Each of the second to z memory blocks BLK2 to BLKz may have the same configuration as the first memory block BLK1.

The first memory block BLK1 is connected to a plurality of bitlines BL1 to BLp (p being an integer equal to or greater than 2). The first memory block BLK1 is connected to a plurality of string lines SSL1 to SSLq (q being an integer equal to or greater than 2), first to sixth wordlines WL1 to WL6, a dummy wordline DWL, a ground select line GSL, and a common source line CSL.

A single string line SSL1 is connected to a gate of the string select transistor SST. A string transistor SST is coupled between a single bitline and a sixth memory cell MC6.

First to sixth memory cells MC1 to MC6 are connected in series and coupled between the string select transistor SST and a dummy memory cell DMC. Gate terminals of the first to sixth memory cells MC1 to MC6 are connected to first to sixth wordlines WL1 to WL6, respectively. The present inventive concept is not limited to the first to sixth memory cells MC1 to MC6, and the number of memory cells may be less than six or greater than six.

The dummy memory cell DMC is coupled between the first memory cell MC1 and the ground select transistor GST. A gate terminal of the dummy memory cell is connected to a dummy wordline DWL. The ground select transistor GST is coupled between the dummy memory cell DMC and the common source line CSL. A gate of the ground select transistor GST is connected to the ground select line GSL.

The ground select transistor GST, the dummy memory cell DMC, the first to sixth memory cells MC1 to MC6, and the string select transistor SST coupled between the single bitline BL1 and the common source line CSL constitute a first string 311. A plurality of strings are connected to each of the bitlines BL1 to BLp. Each of the strings has the same configuration as the first string 311.

For brevity of description, a single dummy memory cell was described. The inventive concept is not limited thereto, and one or more dummy memory cells may be connected to the first memory cell MC1.

Figure 5:
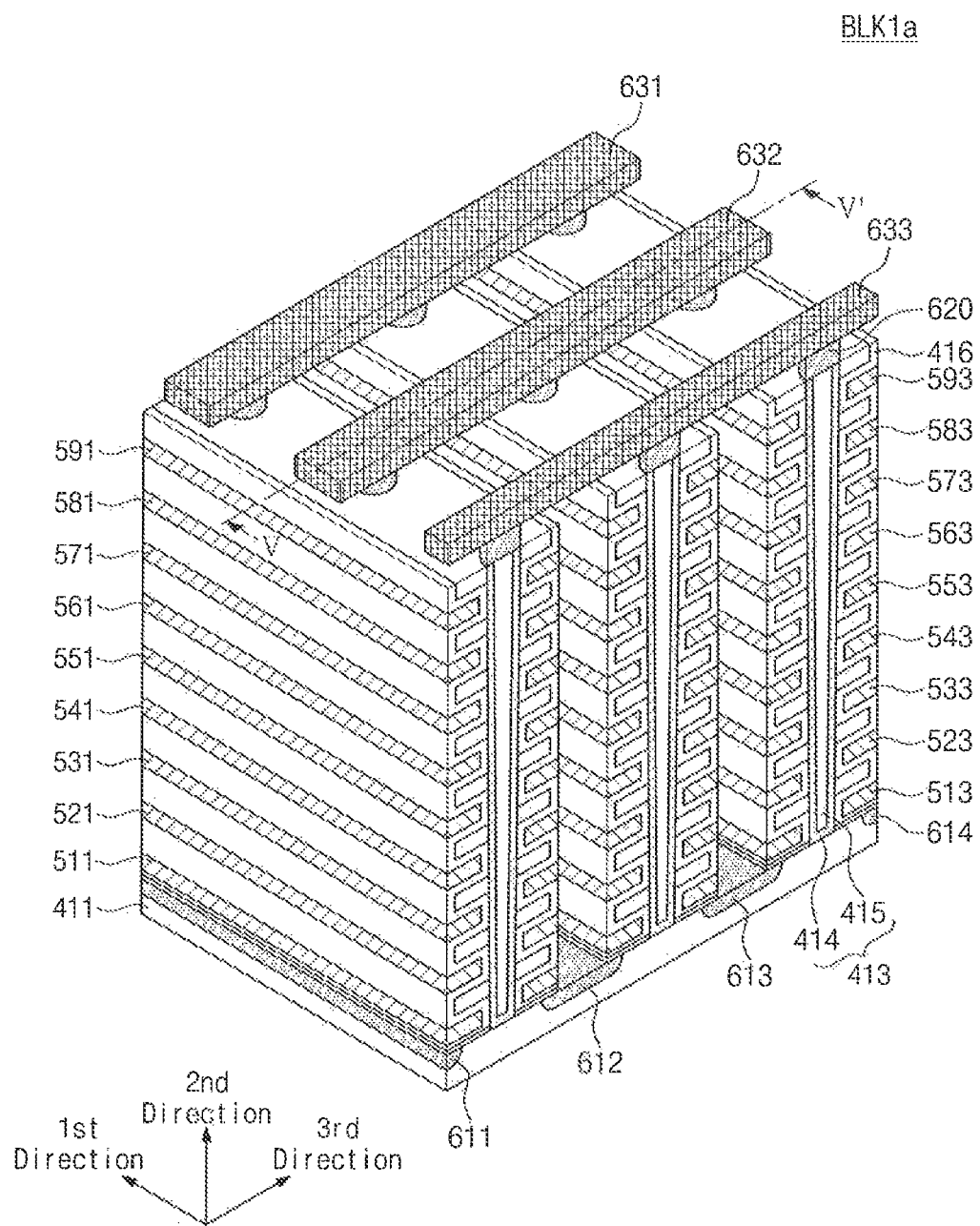
FIG. 5 is a perspective view showing a portion of a memory block in FIG. 4.
Figure 6:
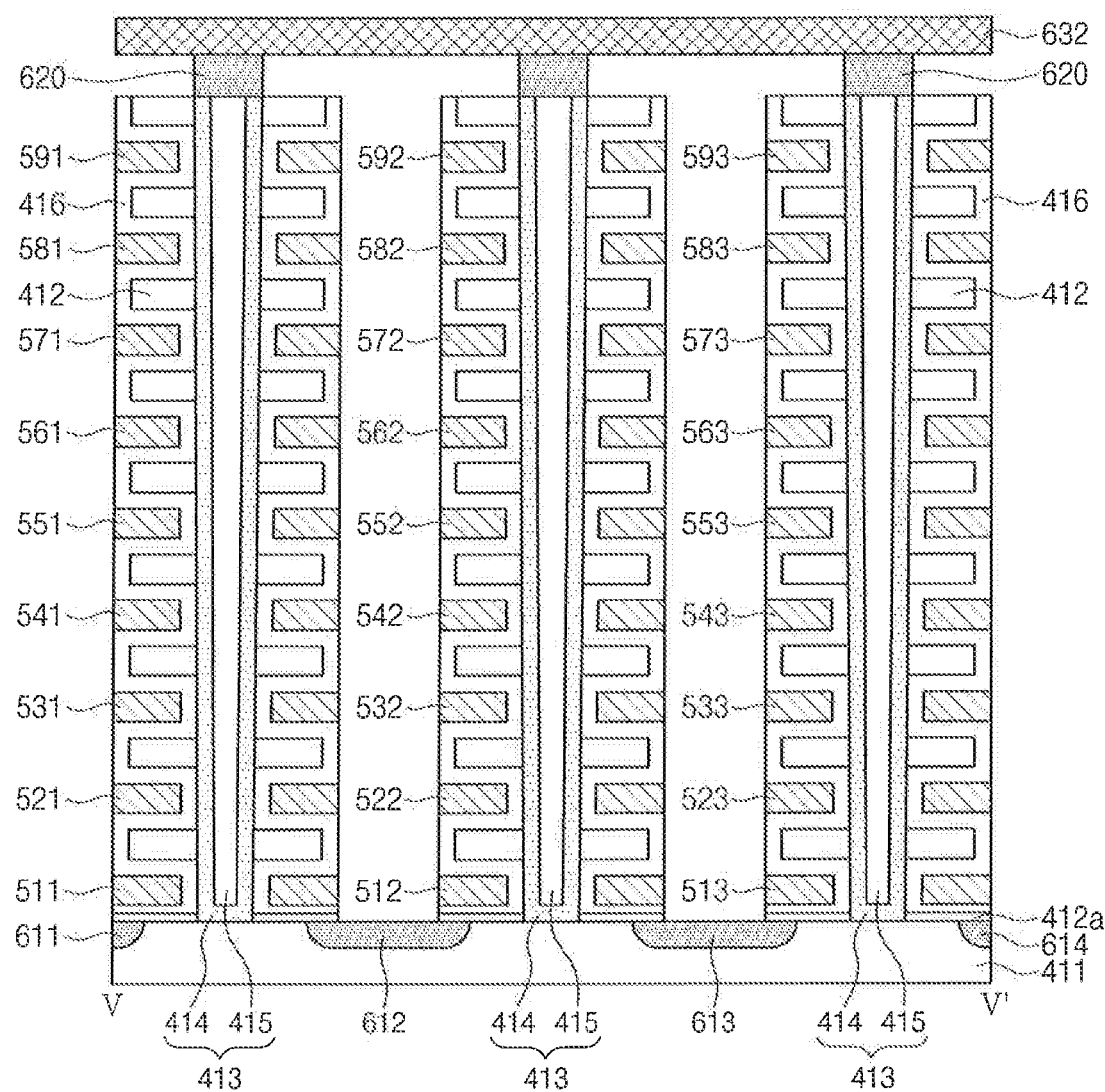
FIG. 6 is a cross-sectional view taken along line V-V' in FIG. 5.

FIG. 5 is a perspective view showing a portion BLK1a of the first memory block BLK1 in FIG. 4, and FIG. 6 is a cross-sectional view taken along line V-V' in FIG. 5. Referring to FIGS. 5 and 6, the portion BLK1a of the first memory block BLK1 includes structures extending in first to third directions.

A substrate 411 is provided. The substrate 411 may be a well having a first type. For example, the substrate 411 may include a silicon material doped with p-type impurities. For example, the substrate 411 may be a p-type well (e.g., p-type pocket well). Hereinafter, the substrate 411 is assumed to be a p-type well (or p-type pocket well). However, the substrate 411 is not limited to the p-type silicon substrate.

A plurality of doped regions 611-614 extending in the first direction are provided on the substrate 411. For example, the doped regions 611-614 may have a second type different from that of the substrate 411. For example, the doped regions 611-614 may have an n-type. Hereinafter, let it be assumed that the doped regions 611-614 may have n-type impurities. However, the conductivity type of the doped regions 611-614 is not limited to the n-type.

On a region of the substrate 411 between the first and second doped regions 611 and 612, a plurality of insulating materials 412 extending in the first direction is sequentially provided in the second direction. For example, the insulating materials 412 are provided in the second direction to be spaced apart from each other at specific intervals. The insulating materials 412 may include an insulating material such as silicon oxide.

On the region of the substrate 411 between the first and second doped regions 611 and 612, a plurality of pillars 413 is provided which are sequentially disposed in the first direction and penetrate the insulating materials 412. In an exemplary embodiment, the pillars 413 may be in contact with the substrate 411 through the insulating materials 412.

In an exemplary embodiment, each of the pillars 413 may include a plurality of layers 414 and 415. For example, the surface layer 414 of each of the pillars 413 may include a silicon material having a first impurity type. For example, the surface layer 414 of each of the pillars 413 may include a silicon material having the same type as the substrate 411. Hereinafter, it is assumed that the surface layer 411 of each of the pillars 413 includes p-type silicon. However, the surface 414 of each of the pillars 413 is not limited to the p-type.

The inner layer 415 of each of the pillars 413 may include an insulating material. For example, the inner layer 415 of each of the pillars 413 may include an insulating material such as silicon oxide. For example, the inner layer 115 of each of the pillars 113 may include an air gap.

In the region between the first and second doped regions 611 and 612, an insulating layer 416 is provided along exposed surfaces of the insulating materials 412, the pillars 413, and the substrate 411. The insulating layer 416 is not disposed on an upper surface of the uppermost insulating material 412 in the second direction.

In the region between the first and second doped regions 611 and 612, first conductive materials 511-591 are provided on an exposed surface of the insulating layer 416. For example, a first conductive material 511 extending in the first direction is provided between the substrate 411 and the insulating material 412 adjacent to the substrate 411. For example, the first conductive material 511 extending in the first direction is provided between the first conductive material 511 and the insulating layer 416 on a bottom surface of the insulating material 412 adjacent to the substrate 411.

Each of the first conductive materials extending in the first direction is provided between a top surface of the insulating layer 416 and a bottom surface of the insulating layer 416. The insulating layer 416 is extended in a sinuous way along the second directions, having multiple top surfaces and bottom surfaces. In an exemplary embodiment, a plurality of first conductive materials 521-581 extending in the first direction is provided between the insulating materials 412. In an exemplary embodiment, the first conductive materials 511-591 may include metal materials. In an exemplary embodiment, the first conductive materials 511-591 may include a conductive material such as polysilicon.

The same structure as that on the first and second doped regions 611 and 612 may be provided in a region between the second and third doped regions 612 and 613. In an exemplary embodiment, a plurality of insulating materials 412 extending in the first direction, a plurality of pillars 413 sequentially disposed in the first direction and penetrating the insulating materials 412 in the third direction, an insulating layer 416 provided on exposed surfaces of the insulating materials 412 and the pillars 413, and a plurality of first conductive materials 512-592 extending in the first direction are provided in the region between the second and third doped regions 612 and 613.

The same structure as that on the first and second doped regions 611 and 612 may be provided in a region between the third and fourth doped regions 613 and 614. In an exemplary embodiment, a plurality of insulating materials 412 extending in the first direction, a plurality of pillars 413 sequentially disposed in the first direction and penetrating the insulating materials 412 in the second direction, an insulating layer 416 provided on exposed surfaces of the insulating materials 412 and the pillars 413, and a plurality of first conductive materials 513-593 extending in the first direction are provided in the region between the third and fourth doped regions 613 and 614.

Drains 620 are provided on the pillars 413, respectively. In an exemplary embodiment, the drains 620 may include silicon materials doped with second-type impurities. For example, the drains 620 may include silicon materials doped with n-type impurities. However, the drains 620 are not limited to the n-type.

In an exemplary embodiment, width of each of the drains 620 may be greater than that of a corresponding pillar 413. For example, each of the drains 620 may be provided on a top surface of a corresponding pillar 412 in the form of a pad. In an exemplary embodiment, each of the drains 620 may extend to a portion of a corresponding surface layer 414.

Conductive materials 631-633 extending in a third direction are provided on the drains 620. The conductive materials 631-633 are arranged in the first direction to be spaced apart from each other at specific intervals. The conductive materials 631 to 633 are connected to the drains 620 in a corresponding region, respectively, in an exemplary embodiment, the drains 620 and the conductive material 633 extending in the third direction are connected through contact plugs, respectively. In an exemplary embodiment, the conductive materials 631-633 may include metal materials. The conductive materials 631-633 may include a conductive material such as polysilicon.

Figure 7:
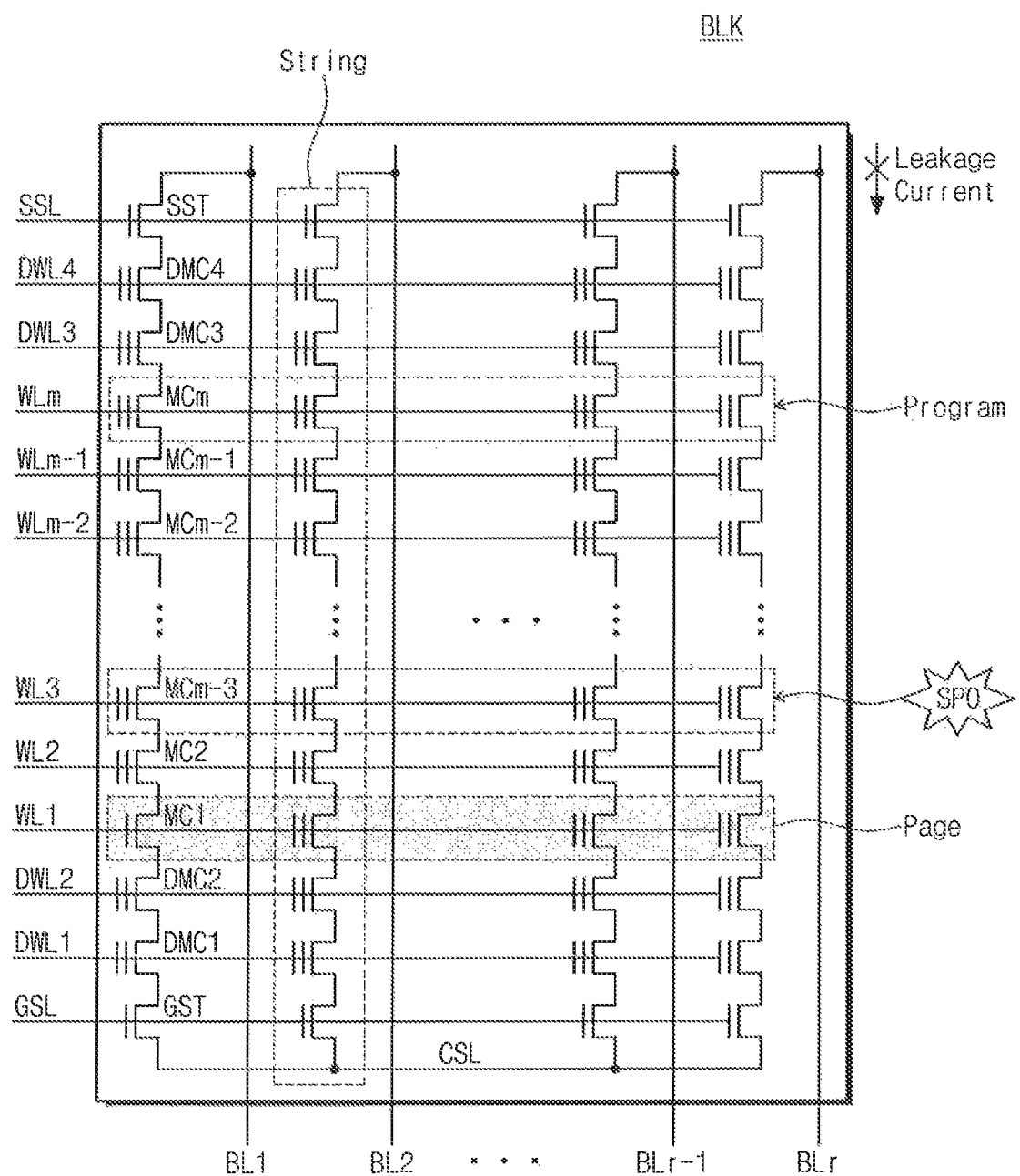
FIG. 7 is a circuit diagram illustrating a program operation of a storage device according to an exemplary embodiment of the inventive concept.

FIG. 7 is a circuit diagram illustrating a program operation of a storage device according to an exemplary embodiment of the inventive concept. Referring to FIG. 7, a memory block BLK includes a plurality of strings connected to a plurality of bitlines BL1 to BLr (r being an integer equal to or greater than 2). Each of the strings may include at least one string select transistor SST, a plurality of dummy memory cells DMC1 to DMC4, a plurality of memory cells MC1 to MCm (m being an integer equal to or greater than 2), and at least one ground select transistor GST. Each of the memory cells MC1 to MCm may store one or more bits of data.

For brevity of description, it is assumed that a single string includes four dummy memory cells DMC1 to DMC4.

A plurality of memory cells may be connected to each of a plurality of wordlines WL1 to WLm. The memory cells connected to each of the wordlines WL1 to WLm may be referred to as a page. Each of the wordlines WL1 to WLm may be applied with wordline voltages required for various operations. The wordline voltages include a program voltage, a pass voltage, a read voltage, and a read pass voltage.

At least one string select transistor SST may be connected to a string select line SSL. The string select line SSL may be applied with a string select voltage for controlling the at least one string select transistor SST. At least one ground select transistor GST may be connected to a ground select line GSL. The ground select line GSL may be applied with a ground select voltage for controlling the at least one ground select transistor GST.

It is assumed that SPO occurs in the memory block BLK while a page connected to a third wordline WL3 is programmed. When the SPO occurs, a dummy data program operation may be performed on a page connected to an uppermost wordline WLm. For example, dummy data may be programmed into the page connected to the uppermost wordline WLm. Leakage current of the memory block BLK may be prevented through the dummy data program operation of the page connected to the uppermost wordline WLm.

When SPO occurs, a memory block that is being programmed is not used any longer. The program operation stopped due to SPO is performed on a new memory block. After the new memory block is programmed, a bitline voltage is applied to a plurality of bitlines to verify the program operation. The bitline voltage applied to the partial block may be blocked by a plurality of string select transistors connected to a string select line. However, coupling may occur between a common source line and the string select line of the partial block.

Such coupling may cause the string select transistors connected to the string select line to form a leakage current path through a partial block. For example, the string select transistors do not fully block the bitline voltage from flowing through a plurality of bitlines through a partial block. Thus, a large amount of leakage current may flow through each string in the partial block.

The large amount of leakage current of the partial block may cause an inaccurate program verify operation of the new memory block. In an exemplary embodiment, at least one upper page of a partial block is programmed to prevent leakage current flowing abnormally flowing through the partial block.

For example, dummy data may be programmed into a page connected to at least one wordline disposed above a page which is incompletely programmed. In addition, the dummy data may be programmed into a page connected to at least one dummy wordline disposed above an uppermost wordline.

The page programmed with dummy data is not limited to the page connected to the uppermost wordline WLm. A page connected to at least one wordline disposed at a lower position than the uppermost wordline WLm may be programmed. The page programmed with the dummy data is not limited to a page connected to a wordline. For example, a dummy page connected a dummy wordline may be programmed with dummy data.

Figure 8:
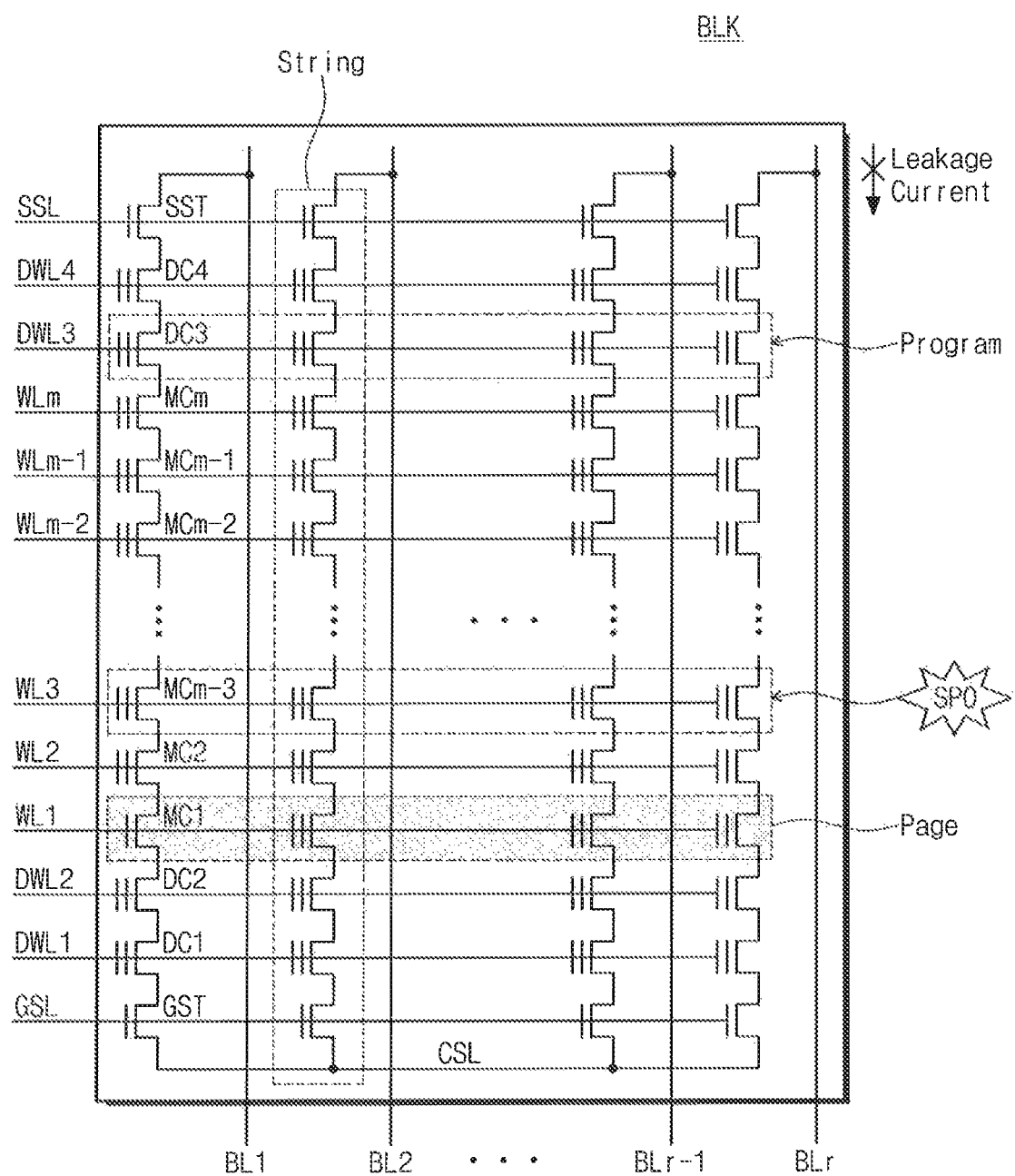
FIG. 8 is a circuit diagram illustrating a program operation of a storage device according to an exemplary embodiment of the inventive concept.

FIG. 8 is a circuit diagram illustrating a program operation of a storage device according to an exemplary embodiment of the inventive concept. Referring to FIG. 8, a memory block BLK includes a plurality of strings. Each of the strings may include at least one string select transistor SST, a plurality of dummy memory cells DMC1 to DMC4, a plurality of memory cells MC1 to MCm, and at least one ground select transistors GST. Each of the memory cells MC1 to MCm may store one or more bits of data. For brevity of description, it is assumed that a single string includes four dummy memory cells DMC1 to DMC4.

The page connected to a third dummy wordlines DWL3 may be programmed with dummy data when SPO occurs when a page connected to a third wordline WL3 is being programmed.

After a dummy program operation is performed on the page of DWL3, the program operation interrupted due to SPO is performed on a new block. A bitline voltage is applied to a plurality of bitlines to perform a program verify operation of the new block. At this point, leakage current that may be applied through the bitlines may be prevented by performing the dummy program operation of the page connected to third dummy wordline DWL3.

For brevity of description, it is assumed that a page of the third wordline WL3 is incompletely programmed due to SPO. A page programmed to prevent leakage current is not limited to the page of the third dummy wordline DWL3. When the SPO occurs, dummy pages connected to dummy wordlines between at least one string select line SSL and an uppermost wordline WLm may be subjected to a dummy program operation.

Figure 9:
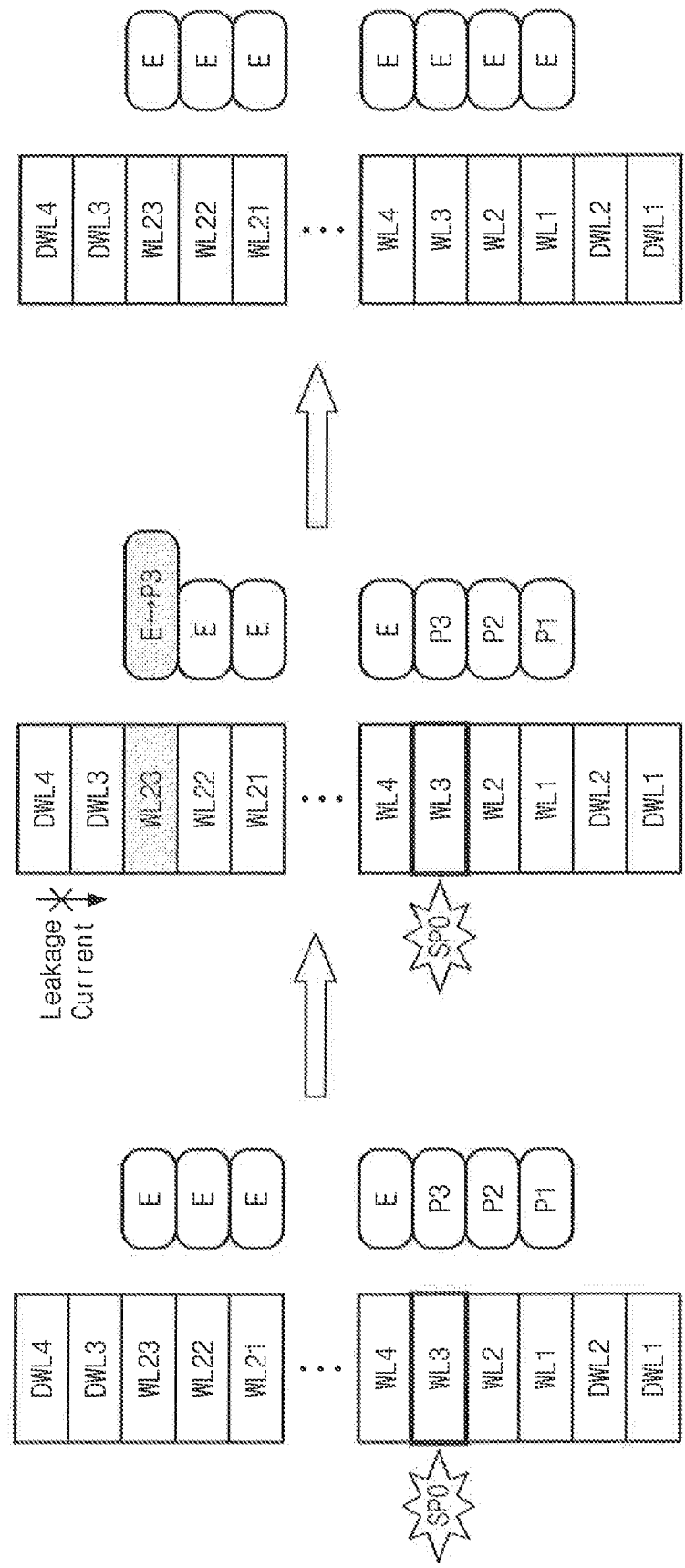
FIG. 9 is a block diagram illustrating a program operation of a storage device according to an exemplary embodiment of the inventive concept.

FIG. 9 is a block diagram illustrating a program operation of a storage device according to an exemplary embodiment of the inventive concept. A memory block includes a plurality of dummy wordlines DWL1 to DWL4 and a plurality of wordlines WL1 to WL23.

For brevity of description, it is assumed that a data program method of a nonvolatile memory device according to the inventive concept is a multi-level cell (MLC) technique. The MLC technique may store two-bit information in a single cell of a memory block. Thus, each memory cell may be programmed with data indicating a plurality of program states E to P3.

For brevity of description, it is assumed that a plurality of cells included in each page is programmed with data of the same program state.

For example, pages connected to first and second wordlines WL1 and WL2 are programmed with data indicating first and second program states P1 and P2, respectively. SPO occurs in a page connected to a third wordline WL3 while the page is programmed with data indicating a third program state P3. Pages connected to fourth to twenty third wordlines WL4 to WL23 are in an erase state. Thus, the block shown in FIG. 9 is a partial block.

SPO may occur in the page connected to the third wordline WL3 during a shadow program operation. SPO may occur in the page connected to the third wordline WL3 during a reprogram operation.

After the SPO occurs, a dummy program operation is performed on a page of the uppermost wordline WL23 with dummy data indicating the uppermost program state P3. Pages connected to fourth to twenty second wordlines WL4 to WL22 remain in the erase state E.

After the page of the uppermost wordline WL23 is programmed, the program operation interrupted due to SPO is performed on a new block. When a bitline voltage is applied through a plurality of bitlines to perform a program verify operation on the new block, leakage current through the partial block may be prevented by the dummy program operation. The inventive concept is not limited thereto, and a dummy program operation may be performed on a page disposed above a page which is subject to SPO.

Before a new program operation is performed on the partial block, data included in all pages are erased.

Figure 10:
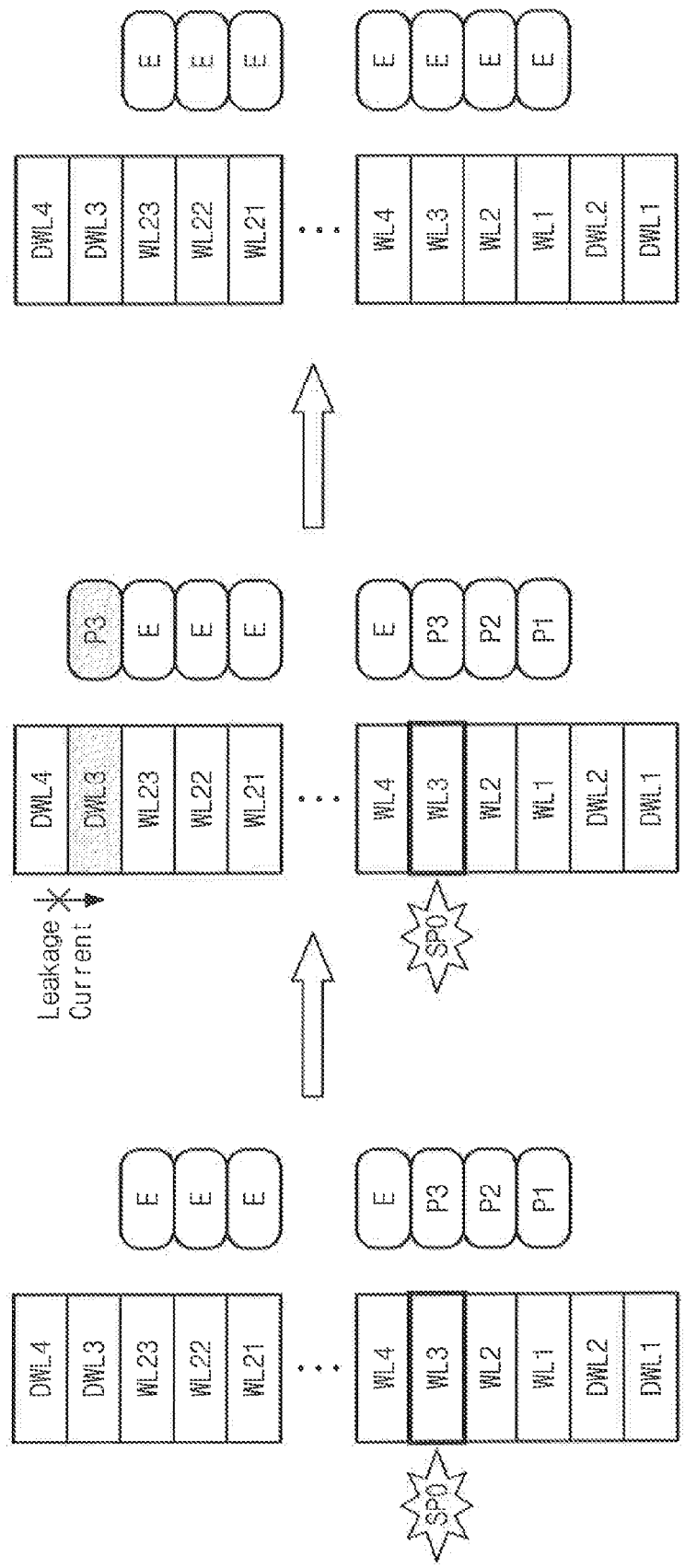
FIG. 10 is a block diagram illustrating a program operation of a storage device according to an exemplary embodiment of the inventive concept.

FIG. 10 is a block diagram illustrating a program operation of a storage device according to an exemplary embodiment of the inventive concept. In this case, SPO occurs when a page of the third wordline WL3 is being programmed with data indicating the third program state P3.

A page of the third dummy wordline DWL3 is programmed with dummy data indicating the third program state P3. Pages of fourth to twenty third wordlines WL4 to WL23 remain in an erase state E. The program of the third dummy wordline DWL3 is performed to prevent leakage current that may occur in the partial block during a program verify operation of a new block.

A page programmed to prevent leakage current is not limited to the page of the third dummy wordline DWL3.

Before a new program operation is performed on the partial block, data included in all pages are erased.

Referring to FIGS. 9 and 10, SPO may occur when a program operation is being performed on a wordline different from the third wordline WL3. A program operation performed on each of the pages connected to the wordlines WL1 to WL3 is not limited to data indicating first to third program states P1 to P3. A page connected to each wordline may be programmed with data indicating various program states.

Referring to FIGS. 9 and 10, the dummy program operation is performed using the third programmed state P3 having the highest threshold voltage range among threshold voltage ranges representing the three programmed states P1 to P3. Since at least on dummy wordline or wordline disposed above a page which is incompletely programmed due to SPO is programmed using the program state P3 having the highest threshold voltage, a leakage path is prevented if a string selection transistor SST of a partial block is coupled. The erased state corresponds to the lowest threshold voltage. The greater threshold voltage is, the less the leakage current is.

The page on which the dummy program operation is performed is disposed between a string selection transistor SST and a page where a program operation is interrupted due to SPO.

For brevity of description, four dummy wordlines DWL1 to DWL4 and twenty three wordlines WL1 to WL23 are shown in FIGS. 9 and 10.

Dummy data used to prevent leakage current is not limited to the data indicating the third program state P3. The dummy data is random data. The dummy data may be randomly selected from data indicating the program states P1 to P3.

Figure 11:
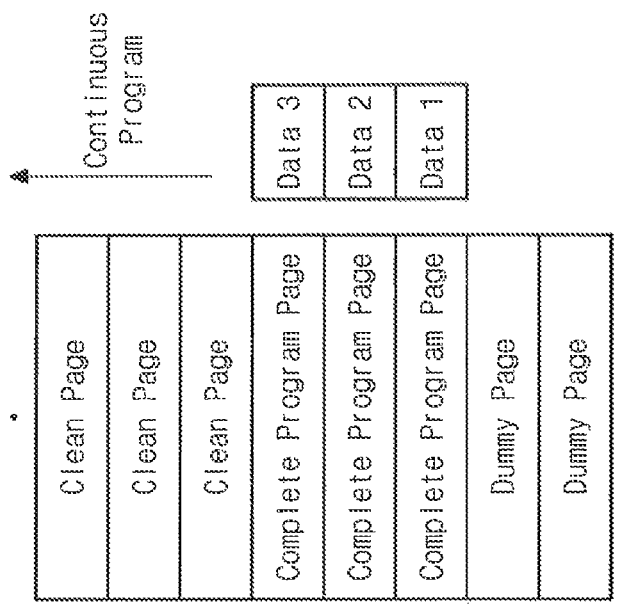
FIG. 11 is a block diagram illustrating a data recovery operation according to an exemplary embodiment of the inventive concept.
Figure 11:
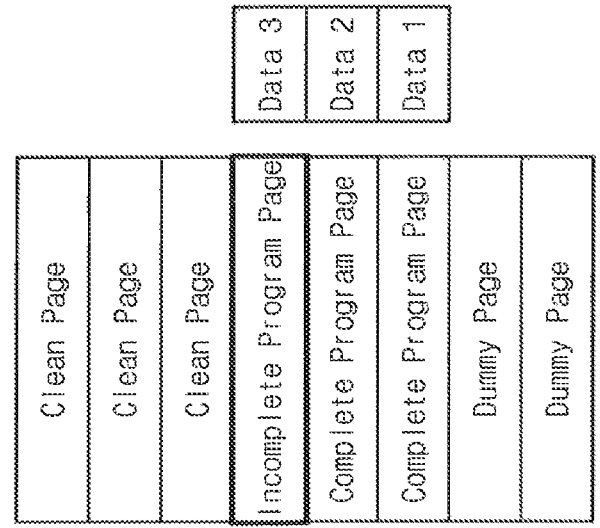
Figure 11:
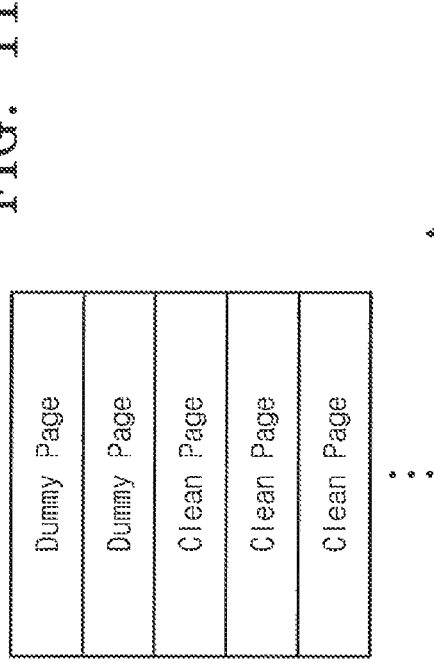
Figure 11:
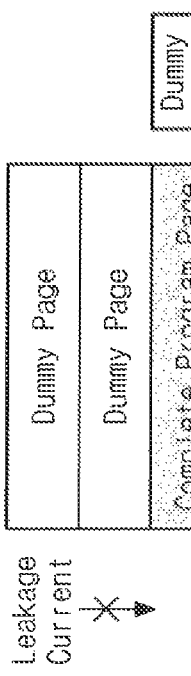

FIG. 11 is a block diagram illustrating a data recovery operation according to an exemplary embodiment of the inventive concept. Referring to FIG. 11, it is assumed that an incomplete program page is formed in a partial block BLKa by SPO. The incomplete program page means a page including incompletely programmed data due to SPO.

There are at least one complete program page and at least one dummy page below an incomplete program page. The complete program page may refer to a page which is completely programmed. There are a plurality of clean page and at least one dummy page above the incomplete program page. The clean page may refer to a page having an erase state. The memory cells in the clean page have the lowest threshold voltage range. In an exemplary embodiment, SPO may occur in the incomplete program page during a shadow program operation, an exemplary embodiment, SPO may occur in the incomplete program page during a reprogram operation of data.

First data Data1 and second data Data2 are normally programmed into complete program pages, while an incomplete program page includes third data Data3 that is incompletely programmed data.

Following occurrence of SPO, a program operation is not performed in the partial block BLKa any longer. The data Data1 to Data3 programmed into the partial block BLKa are copied back to a new memory block BLKb to recover data of the partial block BLKa.

The copyback operation is performed only when the data stored in the partial block BLKa is valid data. If another SPO does not occur in the new memory block BLKb, a program operation of new data is performed on the clean page of the new memory block BLKb.

Following the copyback operation, an operation is performed to erase all the data included in the partial block BLKa.

The uppermost clean page of the partial block BLKa is dummy-programmed to prevent leakage current through the partial block BLKa. After the partial block BLKa is additionally programmed with dummy data, the new block BLKb copies back the valid data of the partial block BLKa. A page programmed with the dummy data is not limited to the uppermost clean page.

Figure 12:
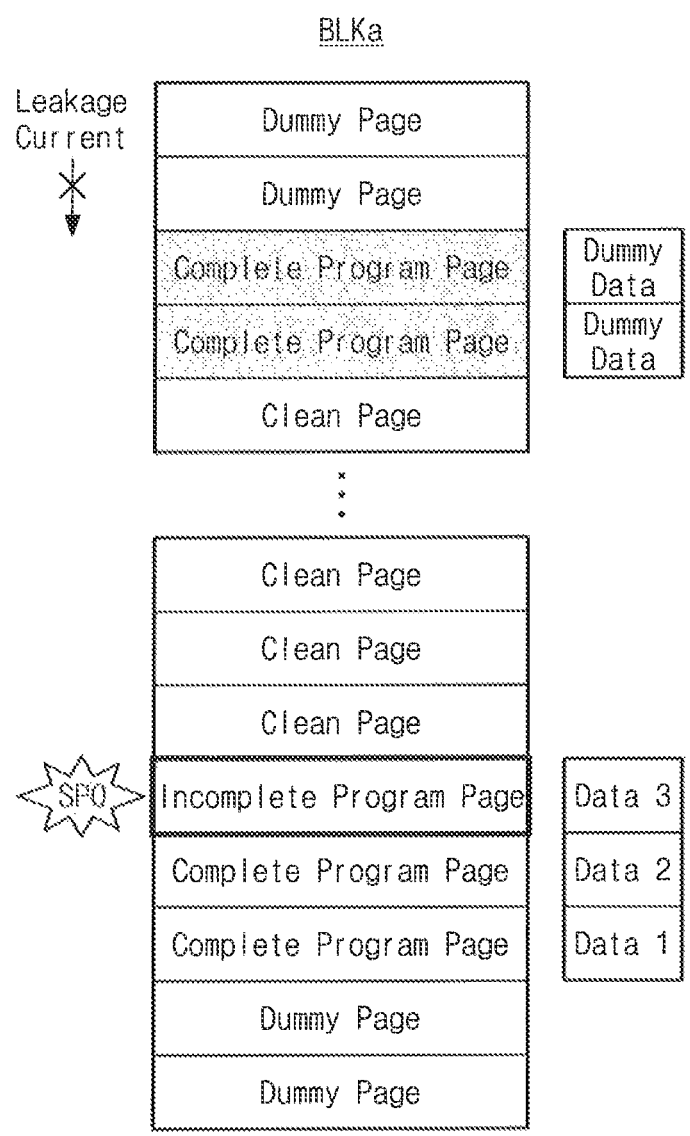
FIG. 12 is a block diagram illustrating a program operation of a storage device according to an exemplary embodiment of the inventive concept.

FIG. 12 is a block diagram illustrating a program operation of a storage device according to an exemplary embodiment of the inventive concept. When SPO occurs, a dummy data program operation may be performed on the uppermost clean page and a clean page below the uppermost clean page. The inventive concept is not limited thereto. The dummy data program operation may also be performed on a plurality of clean pages below the uppermost clean page.

Figure 13:
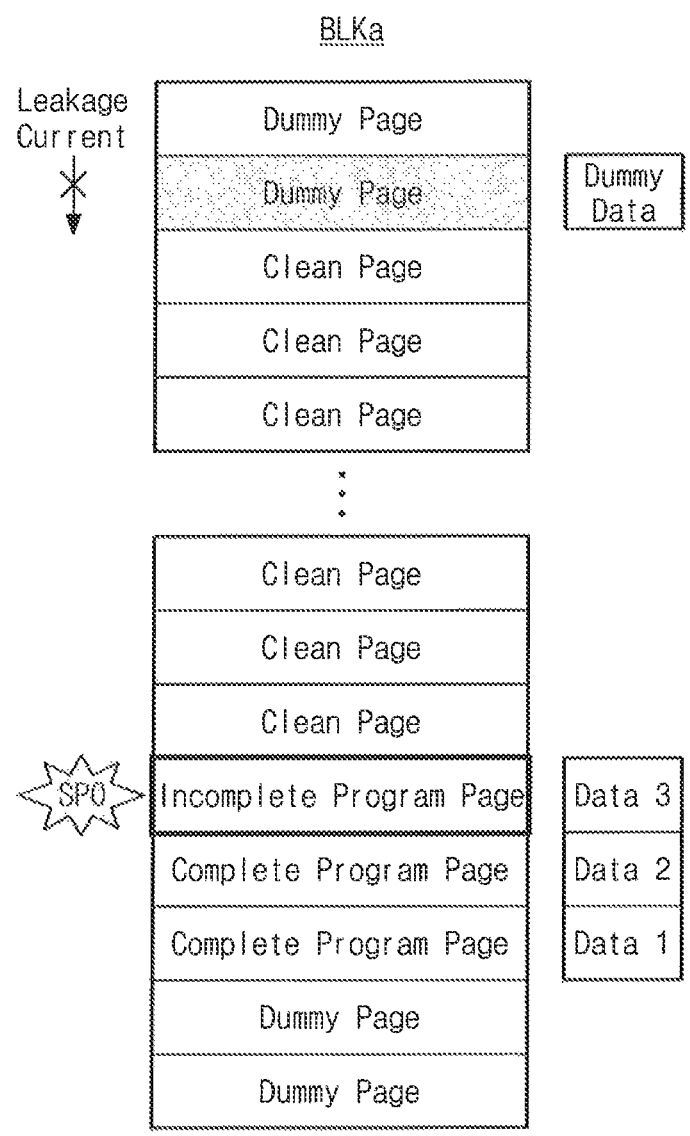
FIG. 13 is a block diagram illustrating a program operation of a storage device according to an exemplary embodiment of the inventive concept.

FIG. 13 is a block diagram illustrating a program operation of a storage device according to an exemplary embodiment of the inventive concept. Referring to FIG. 13, a dummy data program operation may be performed on a dummy page disposed above the uppermost clean page of a partial hock BLKa.

Figure 14:
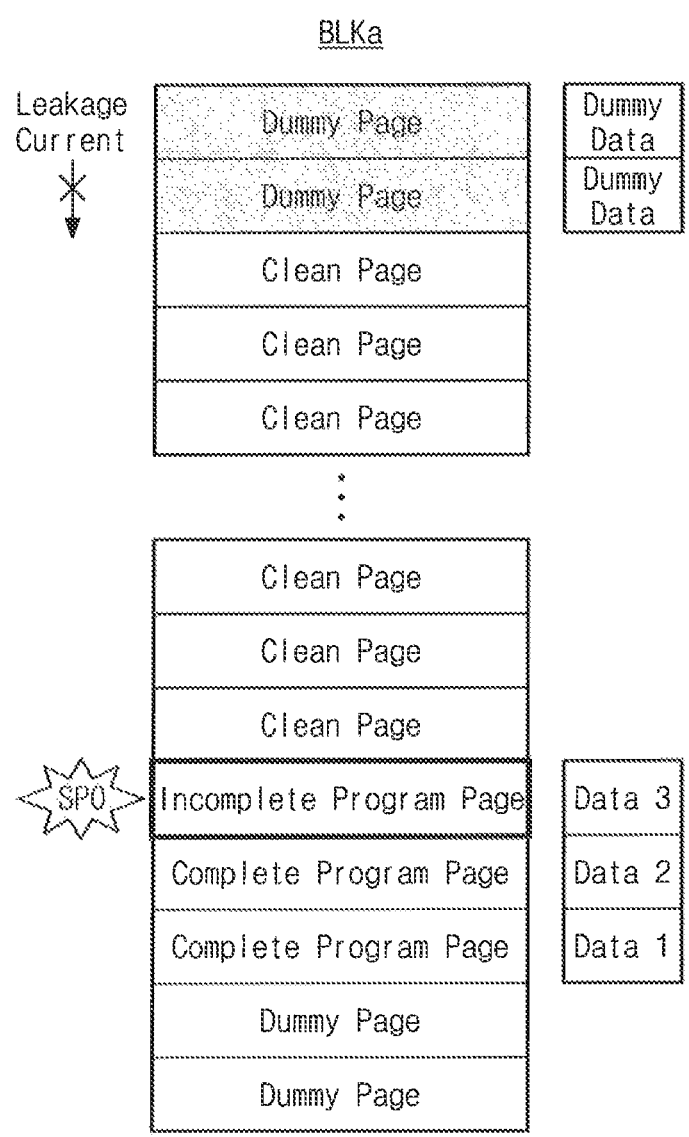
FIG. 14 is a block diagram illustrating a program operation of a storage device according to an exemplary embodiment of the inventive concept.

FIG. 14 is a block diagram illustrating a program operation of a storage device according to an exemplary embodiment of the inventive concept. Referring to FIG. 14, a dummy data program operation may be performed on a plurality of dummy pages disposed above the uppermost clean page of a partial block BLKa.

Figure 15:
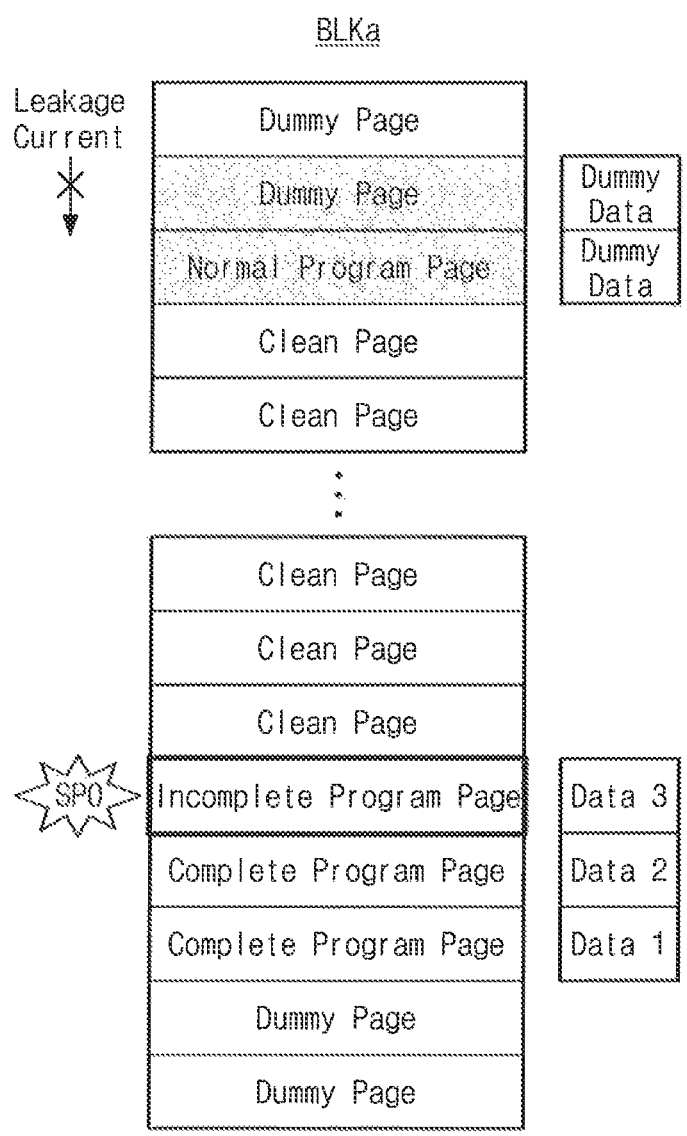
FIG. 15 is a block diagram illustrating a program operation of a storage device according to an exemplary embodiment of the inventive concept.

FIG. 15 is a block diagram illustrating a program operation of a storage device according to an exemplary embodiment of the inventive concept. Referring to FIG. 15, a dummy program operation may be performed on the uppermost clean page of a partial block BLKa and a dummy page disposed above the uppermost page of the partial block BLKa. The inventive concept is not limited thereto. The dummy data program operation may be performed on a plurality of clean pages and a plurality of dummy pages of the partial block BLKa.

Referring to FIGS. 12 to 15, a dummy data program operation may be performed on at least one clean page disposed above an incomplete program page or at least one dummy page. In addition, the dummy data program operation may be performed on at least one clean page and at least one dummy page disposed above an incomplete program page. For example, the at least one clean page and/or at least one dummy page on which a dummy program operation using dummy data having the highest threshold range is disposed between a string selection transistor and a page where SPO occurs.

During a shadow program operation of data, SPO may occur in the incomplete program pages in FIGS. 12 to 15. During a reprogram operation of data, SPO may occur in an incomplete program page according to the inventive concept.

Similar to FIG. 11, referring to FIGS. 12 to 15, a recovery operation is performed on anew block to recover valid data of a partial block BLKa. An additional dummy data program operation of the new block may be performed to prevent leakage current generated by a bitline voltage from flowing through the partial block BLKa during a program verify operation of the new block.

Referring to FIGS. 11 to 15, a page including incompletely programmed data is not limited to a page including third data Data3. SPO may occur during a program operation of more pages. SPO may occur during a program operation of less pages.

Figure 16:
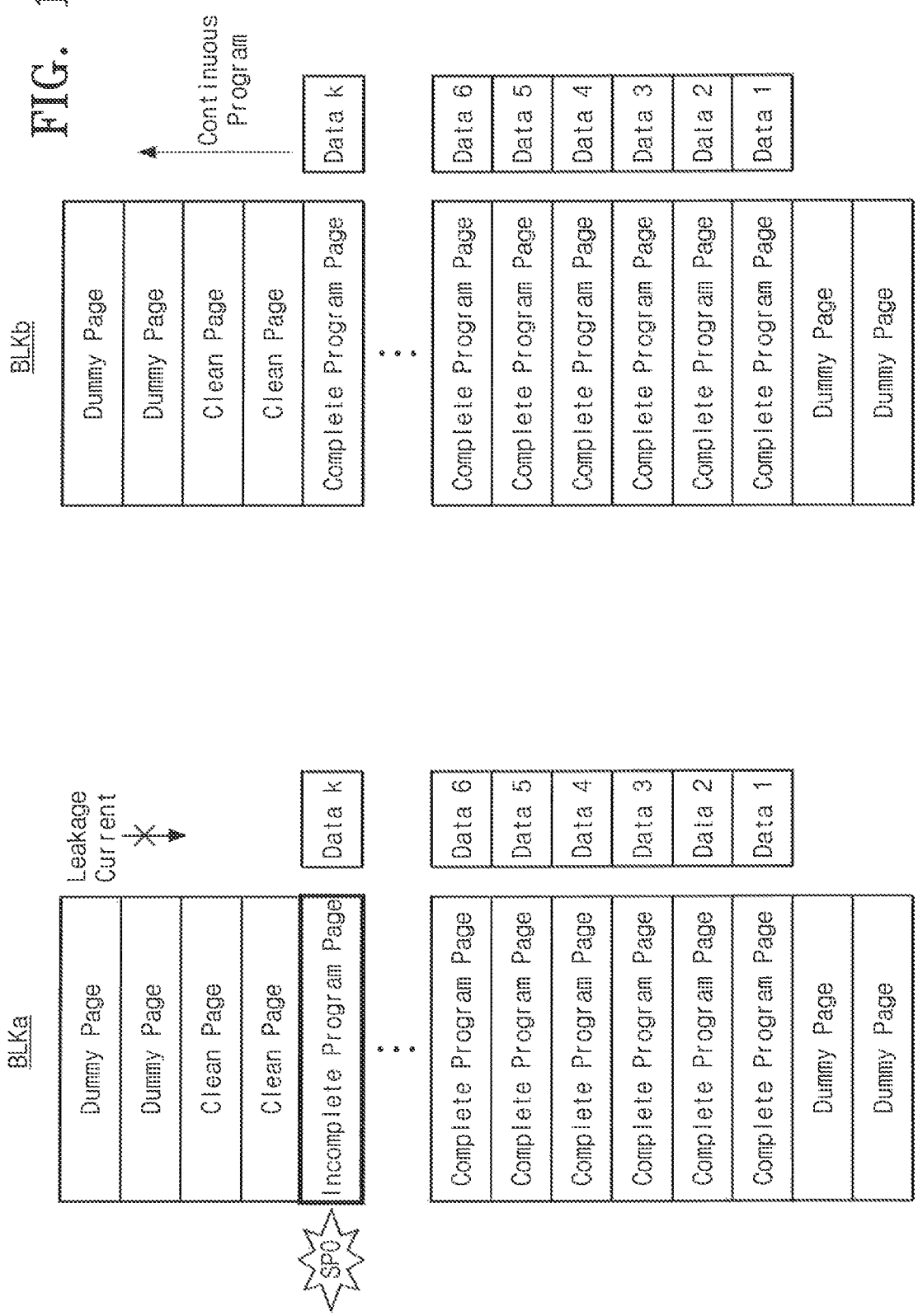
FIG. 16 is a block diagram illustrating a data recovery operation according to an exemplary embodiment of the inventive concept.

FIG. 16 is a block diagram illustrating a data recovery operation according to an exemplary embodiment of the inventive concept. Referring to FIG. 16, complete program pages include first data Data1 to sixth data Data6 that are completely programmed. An incomplete program page includes $k^{th}$ data Data k that is incompletely programmed.

In FIG. 16, it is assumed that a program operation is not performed on an upper page of a partial block BLKa. The partial block program determinators 121 and 221 in the memory controllers 120 and 220 in FIGS. 1 and 2 may determine whether the program operation is performed on the upper page of the partial block BLKa.

In an exemplary embodiment, the partial block program determinators 121 and 221 may determine whether or not need to program an upper page of the partial block BLKa. For example, the partial block program determinators 121 and 221 may determine whether or not need to program an upper page in a partial block BLKa, depending on whether a program verify operation of a new block BLKb is normally completed. If the program verify operation of the new block BLKb is normally completed, the programming of the upper page in the partial block BLKa is not necessary. Otherwise, the programming of the upper page in the partial block BLKa is necessary. After the program operation of the partial block BLKa is stopped, a plurality of data Data1 to Data k (k being an integer equal to or greater than 2) of the partial block BLKa are copied back to the new block BLKb. It is assumed that the data Data1 to Data k are valid data.

After each valid data is programmed into the new block BLKb, program verify operation is performed. If the program verify operation is normally completed, the upper page of the partial block BLKa need not be programmed.

In an exemplary embodiment, the partial block program determinators 121 and 221 may determine whether or not need to program an upper page according to the number of programmed pages of the partial block BLKa.

An upper page means at least one clean page or a dummy page disposed above an incomplete program page. If SPO does not occur during a program operation of the new block BLKb, the new block BLKb may be programmed ahead of clean pages disposed above the complete program page.

FIG. 16 illustrates a copyback operation to copy back valid data of a partial block BLKa into anew block BLKb. The partial block program determinators 121 and 221 of FIGS. 1 and 2 determine whether or not need to program the partial block BLKa. In some embodiments, an upper page need not be programmed even when SPO occurs during a program operation of less data than first to $k^{th}$ data Data 1 to Data k.

FIG. 17 is a flowchart illustrating a programming method of a storage device according to an exemplary embodiment of the inventive concept. The programming method will now be described below with reference to FIGS. 9 to 15 and FIG. 17.

After power is on, whether SPO occurred in a program operation before the power is on is determined (S110). If SPO is detected, a partial block including an incomplete program page (S110) is located. The incomplete program page means a page including incompletely programmed data.

After the incomplete program page is detected, a dummy data program operation is performed on at least one upper clean page of the partial block or at least one dummy page disposed above the uppermost clean page of the partial block (S120). The partial block is a block including a page where a program operation is not completed. The at least one upper clean page is disposed above an incomplete program page. A dummy data program operation may be performed on the at least one upper clean page and the dummy page at the same time. In this case, the dummy data is random data.

Valid data programmed into the partial block is copied back to a new block (S130). The copyback operation is an operation to move the valid data of the partial block to the new block. If another SPO does not occur in the new block, a program operation continues to perform on the new block.

If another SPO occurs in the new block, the programming method in FIG. 17 restarts in a new block.

The inventive concept is not limited thereto. For example, the step S130 for a copyback operation is performed before the step S120 for a dummy program operation.

Figure 18:
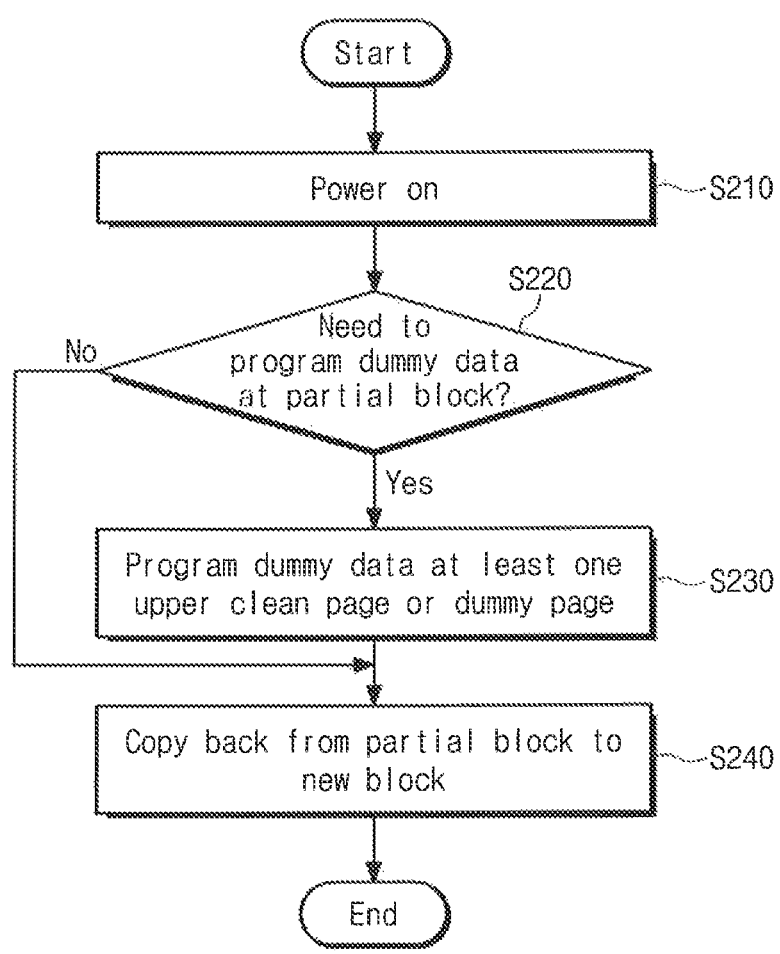
FIG. 18 is a flowchart illustrating a programming method of a storage device according to an exemplary embodiment of the inventive concept.

FIG. 18 is a flowchart for performing a programming method of a storage device according to an exemplary embodiment of the inventive concept. The programming method will now be described with reference to FIGS. 16 and 18.

Power is on (S210). Whether SPO occurred in a program operation is determined (S210). If no SPO detected, the operation proceeds to step S220. Otherwise, the operation proceeds to a normal program operation.

After the incomplete program page is detected, whether or not need to program an upper page of the partial block is determined (S220). The partial block means a block including a page which is incompletely programmed due to the SPO. The upper page program determinators 121 and 221 in FIGS. 1 and 2 determine whether or not need to program the upper page of the partial block.

When the upper page needs to be programmed, a dummy data program operation is performed on at least one upper clean page or a dummy page (S230). The at least one upper page is at least one clean page disposed above the incomplete program page. The dummy page may be disposed above the uppermost clean page.

After the dummy program operation is performed on the at least one clean page or the dummy page, valid data programmed into the partial block is copied back to a new block (S240). When a dummy program operation need not to be performed on an upper page of the incomplete program page, the operation proceeds to step S240 where the programmed valid data is copied back to a new block. When another SPO occurs in the new block, a program procedure described in FIG. 18 restarts in the new block.

The inventive concept is not limited thereto. For example, step S240 for a copyback operation is performed before step S230 for a dummy program operation if it is determined that a dummy operation is necessary in step S220.

FIG. 19 is a flowchart for performing a programming method of a storage device according to an exemplary embodiment of the inventive concept. The programming method will now be described with reference to FIG. 19.

Data is copied back to a new block (S310). The data is valid data programmed into a partial block. The partial block is a memory block that is incompletely programmed due to SPO. After the SPO occurs, the partial block is not used any longer and the programmed valid data is copied to a new block.

After the data is copied back to the new block, a program verify operation is performed and whether the program verify operation is normally completed is determined (S320). A bitline voltage is applied to a plurality of bitlines to verify the program. Leakage current may be generated through the partial block. Excessive leakage current may flow through the partial block due to coupling between a common source line and a string select line of the partial block.

When the program verify operation of the new block is not normally completed due to the excessive leakage current, a dummy program operation is performed on the partial block (S330). A dummy data program operation is performed on at least one clean page disposed above an incomplete program page or at least one dummy page. The incomplete program page is a page in which data is not completely programmed in the partial block due to the SPO.

After the dummy program operation is performed on the partial block, the program verify operation is re-performed on the new block (S340). When the program verify operation of the new block is normally completed, the program operation interrupted due to the SPO is completed. Another program operation is performed (S350).

Figure 20:
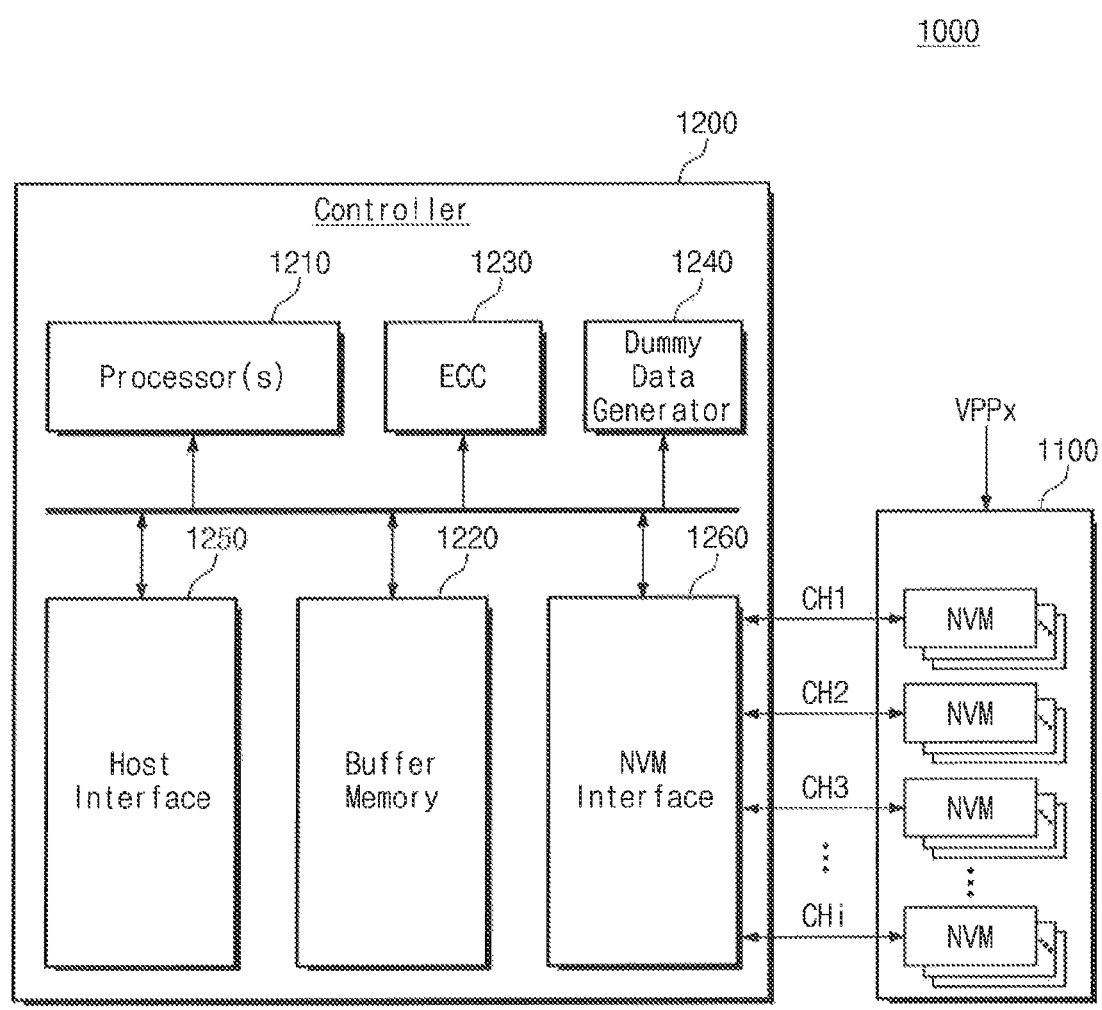
FIG. 20 is a block diagram of a solid state drive (SSD) according to an exemplary embodiment of the inventive concept.

FIG. 20 illustrates a solid state drive (SSD) 1000 according to an exemplary embodiment of the inventive concept. As illustrated, the SSD 1000 includes a nonvolatile memory device 1100 including a plurality of nonvolatile memories and a controller 1200. The nonvolatile memory device 1100 may receive a high voltage Vpp.

The controller 1200 is connected to the nonvolatile memory device 1100 through a plurality of channels CH1 to CHi (i being an integer equal to or greater than 2). The controller 1200 includes at least one processor 1210, a buffer memory 1220, an error correction code (ECC) circuit 1230, a dummy data generator 1240, a host interface 1250, and a nonvolatile memory interface 1260. The controller 1200 determines whether upper page program is necessary to be performed on at least one memory block.

The buffer memory 1220 may temporarily store data required to drive the memory controller 1200. The buffer memory 1220 may store an error rate table (ERT) depending on operation conditions. In an exemplary embodiment, the buffer memory 1220 may include a plurality of memory lines to store data or a command.

The buffer memory 1220 may buffer data to be used in a fine program operation during a write request. In FIG. 19, the buffer memory 1220 is disposed inside the controller 1200. However, the inventive concept is not limited thereto. The buffer memory 1220 may be disposed outside the controller 1200.

The ECC circuit 1230 may calculate an ECC value of data to be programmed during a write operation, correct an error of data read during a read operation based on the ECC value, and correct an error of recovered data from the nonvolatile memory device 1100 during a data recovery operation.

The dummy data generator 1240 generates dummy data. The dummy data generator may generate dummy data using a seed value. The dummy data may be random data.

The host interface 1250 may provide interface with an external device. The nonvolatile memory interface 1260 may provide interface with the nonvolatile memory device 1100.

Figure 21:
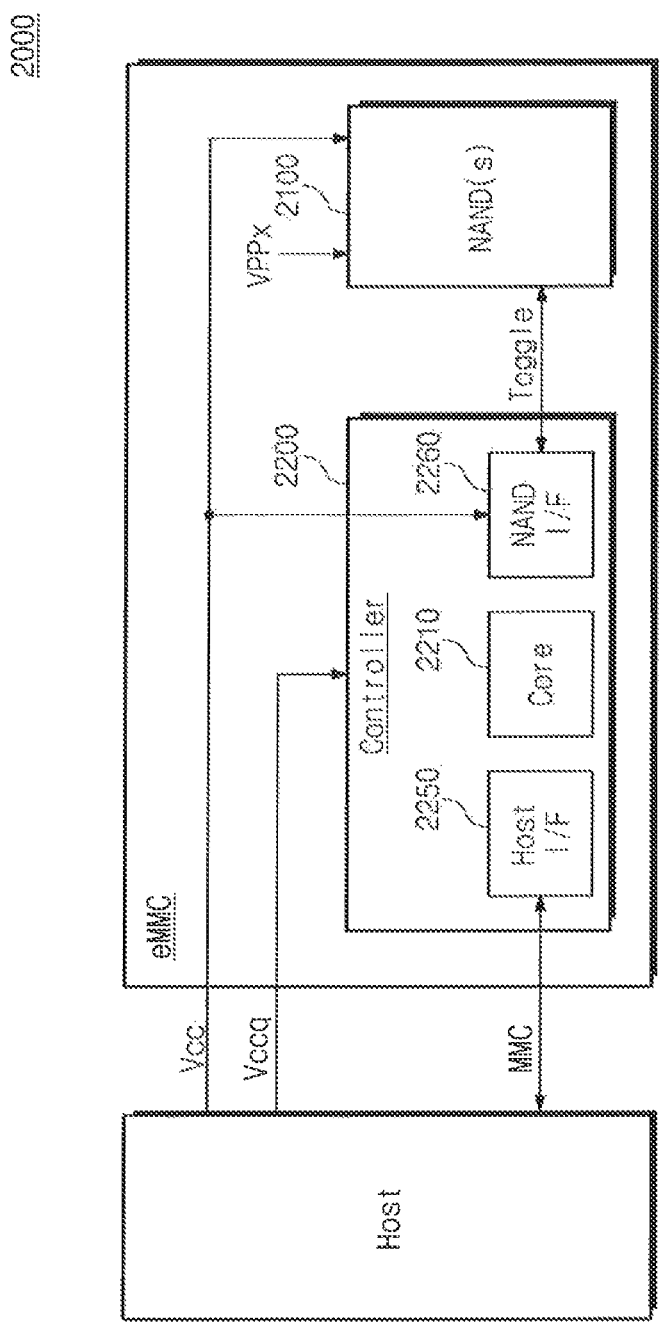
FIG. 21 is a block diagram of an embedded multimedia card (eMMC) according to an exemplary embodiment of the inventive concept.

FIG. 21 illustrates an embedded multimedia card (eMMC) 2000 according to an exemplary embodiment of the inventive concept. The inventive concept may be applied to an eMMC. As illustrated, the eMMC 2000 may include at least one NAND flash memory device 2100 and a controller 2200.

The controller 2200 is connected to the NAND flash memory device 2100 through a plurality of channels. The controller 2200 may include at least one controller core 2210, a host interface 2250, and a NAND interface 2260. The at least one control core 2210 controls the overall operation of the eMMC 2000. The host interface 2250 may provide host interface with the controller 2200. The NAND interface 2260 may provide interface between the NAND flash memory device 2100 and the controller 2200.

In an exemplary embodiment, the host interface 2250 may be a parallel interface (e.g., MMC interface). Alternatively, the host interface 2250 of the eMMC 2000 may be a serial interface (e.g., UHS-II or UFS interface).

The eMMC 2000 receives first and second power supply voltages Vcc and Vccq from a host. The first power supply voltage Vcc is supplied to the NAND flash memory device 2100 and the NAND interface 2260, and the second power supply voltage Vccq is supplied to the controller 2200.

Figure 22:
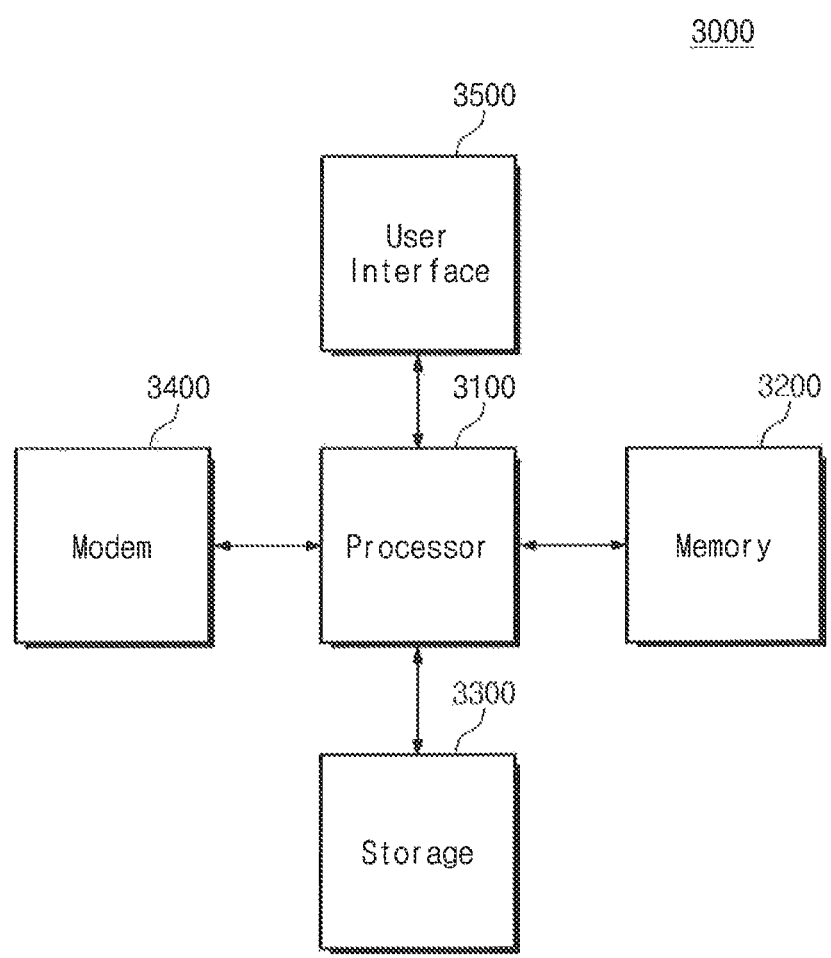
FIG. 22 is a block diagram of a computing device according to an exemplary embodiment of the inventive concept.

FIG. 22 is a block diagram of a computing device 3000 according to an exemplary embodiment of the inventive concept. As illustrated, the computing device 3000 includes a processor 3100, a memory 3200, a storage 3300, a modem 3400, and a user interface 3500. The processor 3100 may control the overall operation of the computing device 3000 and perform a logic operation. For example, the processor 3100 may be a universal processor or an application processor.

The memory 3200 may communicate with the processor 3100. The memory 3200 may be a working memory of the processor 3100 or the computing device 3000. The memory 3200 may include a volatile memory such as static random access memory (SRAM), dynamic RAM (DRAM), and synchronous DRAM (SDRAM) or a nonvolatile memory such as phase-change RAM (PRAM), magnetic RAM (MRAM), resistive RAM (RRAM) and ferroelectric RAM (FRAM).

The storage 3300 may store data that the computing device 3000 desires to stores for a long period. The storage 3300 may include a hard disk drive (HDD) or a nonvolatile memory device such as flash memory, phase-change RAM (PRAM), magnetic RAM (MRAM), resistive RAM (RRAM), and ferroelectric RAM (FRAM).

The storage 3300 may be the nonvolatile memory device described with reference to FIGS. 1 to 17. As described with reference to FIGS. 1 to 17, the storage 3300 may program an upper page of a partial block where SPO occurs to prevent leakage current from flowing through the partial block from bitlines.

The memory 3200 and the storage 3300 may include the same type of nonvolatile memory devices. In this case, the memory 3200 and the storage 3300 may include a single semiconductor integrated circuit.

The modem 3400 may be configured to communicate with an external device according to the control of the processor 3100. For example, the modem 3400 may perform wired or wireless communications with an external device. The modem 3400 may perform communications based on at least one of wireless communication techniques or protocols such as LTE (Long Term Evolution), WiMax, GSM (Global System for Mobile communication), CDMA (Code Division Multiple Access), Bluetooth, NFC (Near Field Communication), WiFi, and RFID (Radio Frequency Identification) or wired communication techniques or protocols such as USB (Universal Serial Bus), SATA (Serial AT Attachment), SCSI (Small Computer Small Interface), Firewire, and PCI (Peripheral Component interconnection).

The user interface 3500 may communicate with a user according to the control of the processor 3100. For example, the user interface 3500 may include user input interfaces such as a keyboard, a keypad, a button, a touch panel, a touch screen, a touch ball, a touch pad, a camera, a gyroscope sensor, and a vibration sensor. The user interface 3500 may include user output interfaces such as an liquid crystal display (LCD), an organic light emitting diode (OLED) display, an active matrix OLED (AMOLED) display, an LED, a speaker, and a motor.

While the present inventive concept has been shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. A storage device comprising:
 a nonvolatile memory device including a plurality of blocks; and
 a memory controller configured to:
 detect, upon receiving a power-on signal, a partial block among the plurality of blocks, wherein the partial block includes a first page incompletely programmed due to sudden power-off occurred to the storage device;
 determine whether or not to perform a dummy program operation on the partial block; and program a second page of the partial block with dummy data,
wherein the first page is different from the second page, and
wherein the dummy data is data indicating a program state having a highest threshold voltage range among a plurality of program states.

2. The storage device of claim 1,
wherein the memory controller comprises:
a partial block program determinator configured to perform the detecting of the partial block and the determining of whether or not to perform the dummy program operation on the partial block; and
a dummy data generator configured to perform the programming of the second page of the partial block with the dummy data according to a result of the determining of whether or not to perform the dummy program operation.

3. The storage device of claim 2,
wherein the memory controller is further configured to perform a copyback operation based on a detection result of detecting of the partial block,
wherein the copyback operation moves valid data of the partial block to another block of the plurality of blocks.

4. The storage device of claim 1,
wherein the second page is at least one clean page disposed above the first page or a dummy page disposed above the first page.

5. An operating method of a storage device including a nonvolatile memory device including a plurality of blocks and a memory controller configured to control the nonvolatile memory device, the operating method comprising:
detecting a partial block, wherein the partial block includes a first page incompletely programmed due to sudden power-off occurred to the storage device; and
performing a dummy program operation on a second page of the partial block by using dummy data, wherein the first page is different from the second page,
wherein the dummy data is data indicating a program state having a highest threshold voltage range.

6. The operating method of claim 5, further comprising:
performing a copyback operation to move valid data of the partial block to one of the plurality of blocks after performing the dummy program operation on the partial block, wherein the one of the plurality of blocks is different from the partial block.

7. The operating method of claim 6, further comprising:
erasing the partial block after performing the copyback operation.

8. The operating method of claim 5,
wherein the second page includes at least one clean page.

9. The operating method of claim 8,
wherein the second page includes at least one dummy page.

10. The operating method of claim 9,
wherein the dummy program operation includes performing a program operation on the at least one clean page and the at least one dummy page at substantially the same time.

11. The operating method of claim 6, further comprising:
determining whether or not to perform the dummy program operation on the partial block before the performing of the dummy program operation.

12. The operating method of claim 11,
wherein the performing of the dummy program operation is made according to a determination result of the determining of whether or not to perform the dummy program operation.

13. The operating method of claim 11,
wherein the determination is made according to power supply information of the partial block.

14. The operating method of claim 12,
wherein the performing of the copyback operation includes performing a program verify operation on the one of the plurality of blocks, and wherein the determination is made according to a result of the program verify operation.

15. An operating method of a storage device comprising:
detecting whether a nonvolatile memory includes a partial block, wherein the partial block includes a first page incompletely programmed due to sudden power-off occurred to the storage device;
performing a dummy program operation on a second page of the partial block using dummy data, wherein the second page is disposed between the first page and a string selection transistor of the nonvolatile memory;
performing a copyback operation to move valid data of the partial block to another block different from the partial block; and
erasing the partial block after performing the copyback operation,
wherein the dummy data represents a threshold voltage within a highest threshold voltage range.

16. The operating method of claim 15,
wherein the detecting of whether the nonvolatile memory includes the partial block is performed upon receiving a power-on signal.

17. The operating method of claim 15,
wherein the second page includes at least one clean page or at least one dummy page.

18. The operating method of claim 17, further comprising:
storing information of the sudden power-off,
wherein the detecting of whether the nonvolatile memory includes the partial block is determined based on the information of the sudden power-off.

* * * * *